US008558460B2

(12) United States Patent
Nonomura et al.

(10) Patent No.: US 8,558,460 B2
(45) Date of Patent: *Oct. 15, 2013

(54) PLASMA PROCESSING APPARATUS

(75) Inventors: Masaru Nonomura, Osaka (JP);
Hiroshi Haji, Osaka (JP); Kiyoshi Arita, Osaka (JP)

(73) Assignee: Panasonic Corporation, Osaka (JP)

( * ) Notice: Subject to any disclaimer, the term of this patent is extended or adjusted under 35 U.S.C. 154(b) by 156 days.

This patent is subject to a terminal disclaimer.

(21) Appl. No.: 13/146,086

(22) PCT Filed: Jan. 25, 2010

(86) PCT No.: PCT/JP2010/000405
§ 371 (c)(1),
(2), (4) Date: Jul. 25, 2011

(87) PCT Pub. No.: WO2010/084779
PCT Pub. Date: Jul. 29, 2010

(65) Prior Publication Data
US 2011/0277933 A1 Nov. 17, 2011

(30) Foreign Application Priority Data

Jan. 26, 2009 (JP) .................. 2009-013992

(51) Int. Cl.
*H01J 7/24* (2006.01)
(52) U.S. Cl.
USPC .................................... 315/111.21
(58) Field of Classification Search
USPC .................... 315/111.21, 111.71, 111.61;
156/345.24, 345.25, 345.26, 345.28;
118/723 R, 723 VE, 723 MW, 723 ME;
216/67, 69; 345/60
See application file for complete search history.

(56) References Cited

U.S. PATENT DOCUMENTS

| 5,879,574 | A | * | 3/1999 | Sivaramakrishnan et al. ... 216/60 |
| 6,792,889 | B2 | * | 9/2004 | Nakano et al. ............ 118/723 E |
| 6,796,269 | B2 | * | 9/2004 | Sasaki et al. ............. 118/723 E |
| 7,102,292 | B2 | * | 9/2006 | Parsons et al. .......... 315/111.21 |
| 2005/0159835 | A1 | | 7/2005 | Yamada et al. |
| 2005/0194094 | A1 | | 9/2005 | Yasaka |
| 2006/0224265 | A1 | | 10/2006 | Nakayama et al. |

FOREIGN PATENT DOCUMENTS

| JP | 63-177415 A | 7/1988 |
| JP | 02-202019 A | 8/1990 |
| JP | 06-282663 A | 10/1994 |
| JP | 07-234133 A | 9/1995 |
| JP | 11-054464 A | 2/1999 |
| JP | 11-067732 A | 3/1999 |
| JP | 2001-102196 A | 4/2001 |

(Continued)

OTHER PUBLICATIONS

International Search Report for PCT/JP2010/000405 dated Apr. 27, 2010.

*Primary Examiner* — Minh D A
(74) *Attorney, Agent, or Firm* — Pearne & Gordon LLP

(57) ABSTRACT

A plasma processing apparatus includes: a vacuum chamber; a plasma processing execution portion; a discharge state detecting unit; a window portion; a camera; a first storing portion; a second storing portion; and an image data extracting unit. The image data extracting unit extracts at least moving image data, which show the generation state of the abnormal discharge, from the first storing portion and stores the extracted moving image data in the second storing portion when the discharge state detecting unit detects the abnormal discharge.

6 Claims, 11 Drawing Sheets

(56) References Cited

FOREIGN PATENT DOCUMENTS

| | | |
|---|---|---|
| JP | 2001-319922 A | 11/2001 |
| JP | 2003-173973 A | 6/2003 |
| JP | 2003-318115 A | 11/2003 |
| JP | 2005-197323 A | 7/2005 |
| JP | 2006-277298 A | 10/2006 |
| JP | 2007-305612 A | 11/2007 |
| JP | 2008-130755 A | 6/2008 |
| JP | 2009-064610 A | 3/2009 |

* cited by examiner

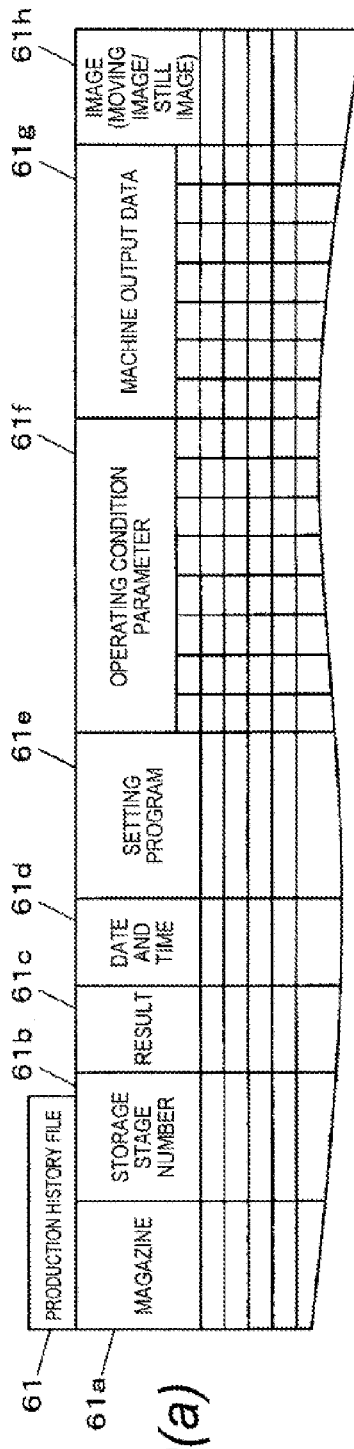
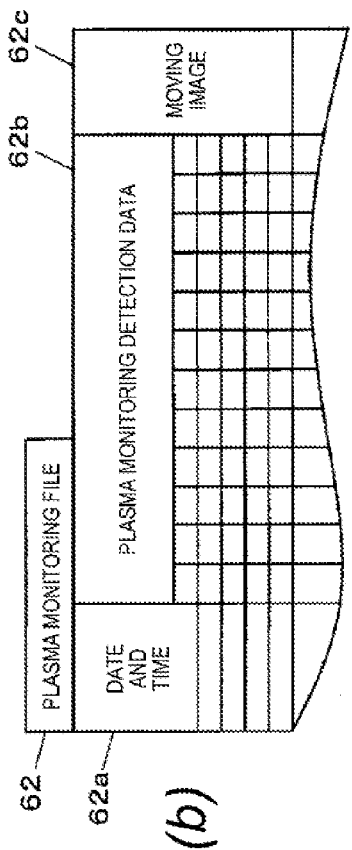
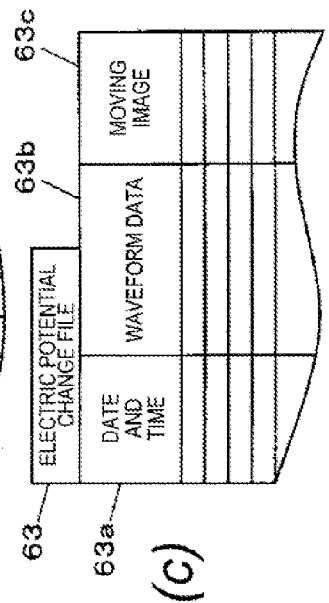
FIG. 10(a)
FIG. 10(b)
FIG. 10(c)

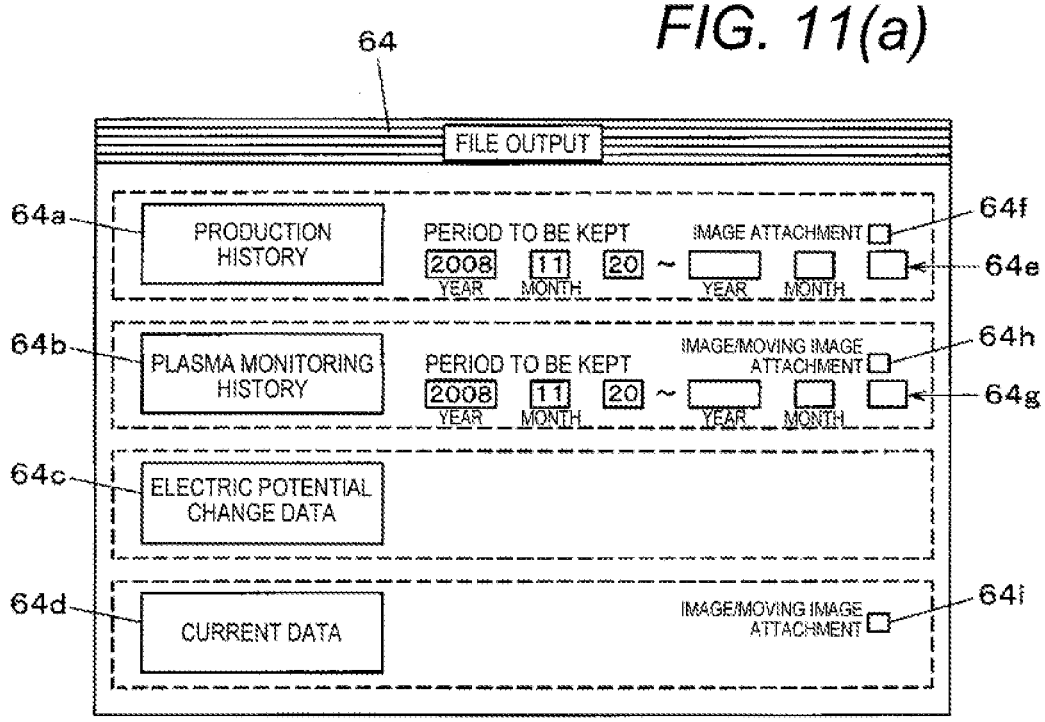

PLASMA PROCESSING APPARATUS

TECHNICAL FIELD

The present invention relates to a plasma processing apparatus that executes plasma processing for an object to be processed, such as a board.

BACKGROUND ART

Plasma processing is well known as a surface processing method for cleaning or etching an object to be processed, such as a board on which electronic parts are mounted. In the plasma processing, the board to be processed is placed in a vacuum chamber forming a processing chamber. Then, plasma discharge is generated in the processing chamber such that ions and electrons generated as a result of the plasma discharge are made to act on the surface of the board, whereby desired surface processing is executed. In order to stably execute the plasma processing at high quality, it is necessary to generate plasma discharge properly in response to discharging conditions which have been previously determined according to a purpose of processing. Therefore, for the purpose of monitoring a state of the generation of the plasma, various means and methods have been proposed (see Patent Documents 1 to 3).

In Patent Document 1, a discharge detection sensor including a probe electrode for detecting an electric potential is attached to a vacuum chamber including a processing chamber, and detects a change in the electric potential induced at the probe electrode according to the change of plasma, thereby detecting whether an abnormal discharge exists in the processing chamber. In Patent Document 2, an image of the inside of a reaction chamber is taken by a camera, and the generation and the generation position of abnormal discharge are specified by the detection of emission of light caused by the abnormal discharge. In Patent Document 3, plasma light in a plasma chamber is detected by an image sensor such as a CCD, so that a plasma process is monitored.

RELATED ART DOCUMENTS

Patent Documents

Patent Document 1: JP-A-2003-318115
Patent Document 2: JP-A-2001-319922
Patent Document 3: JP-A-11-67732

SUMMARY OF THE INVENTION

Problem to be Solved by the Invention

Recently, in a field of manufacturing an electronic part to which plasma processing is applied, more detailed quality management as compared with the related art is required for high quality parts such as in-vehicle parts that require high durability. For this reason, even in a plasma processing process, it is necessary to stabilize processing quality not only by detecting just the abnormal discharge but also by ascertaining the cause of the abnormality.

However, in the related art disclosed in the above-mentioned Patent Documents, the generation of an abnormal discharge can be detected, but data useful for ascertaining the cause of the abnormality are not provided. For this reason, when the cause of the abnormality is tried to be ascertain, it is necessary to repeat tests by trial and error with much time and effort and labor for the purpose of reproducing the abnormality. Since many elements are complicatedly correlated to a state where plasma is generated even in the above-mentioned reproduced tests, it is not possible to reproduce abnormality in a strict sense. Accordingly, it is very difficult to ascertain the cause of the abnormality.

An object of the invention is to provide a plasma processing apparatus that can acquire data useful for ascertaining the cause of the abnormal discharge in plasma processing.

Means for Solving the Problem

A plasma processing apparatus according to the invention includes a vacuum chamber, a plasma processing execution portion, and a discharge state detecting unit. The vacuum chamber forms a processing chamber in which an object to be processed is accommodated. The plasma processing execution portion introduces plasma generating gas into the processing chamber under a reduced pressure state in the processing chamber, excites the plasma generating gas by applying a high frequency voltage, and executes plasma processing for the object to be processed accommodated in the processing chamber. The discharge state detecting unit detects an abnormal discharge in the processing chamber. The plasma processing apparatus includes a window portion, a camera, a first storing portion, a second storing portion, and an image data extracting unit. The window portion is formed at the vacuum chamber. The camera takes images of the inside of the vacuum chamber through the window portion and outputs moving image data. The first storing portion stores the moving image data output from the camera. The second storing portion stores moving image data extracted from the first storing portion. The image data extracting unit extracts at least moving image data, which show the generation state of an abnormal discharge, from the first storing portion and stores the extracted moving image data in the second storing portion when the discharge state detecting unit detects an abnormal discharge.

Advantages of the Invention

According to the invention, a plasma processing apparatus, which accommodates an object to be processed in a processing chamber and executes plasma processing, can acquire moving image data useful for ascertaining the cause of an abnormal discharge in plasma processing by storing moving image data including at least a generation state of an abnormal discharge when a discharge state detecting unit detecting an abnormal discharge in the processing chamber detects an abnormal discharge.

BRIEF DESCRIPTION OF THE DRAWINGS

FIGS. 2(a) and (b) are views illustrating the operation of the plasma processing apparatus according to the embodiment of the invention, in which FIG. 2(a) is a view illustrating a state where a lid portion is moved up and FIG. 2(b) is a view illustrating a state where a lid portion is moved down.

FIGS. 5(a) and 5(b) are views illustrating the function of a discharge state detecting portion of the plasma processing apparatus according to the embodiment of the invention, in which FIG. 5(a) is a view showing the structure of the discharge state detecting portion and FIG. 5(b) is a graph showing electric potential change data, which is output from a probe electrode of the discharge detection sensor at the time of the operation of the plasma processing apparatus and is stored in an electric potential change storing portion, as waveforms.

FIGS. 7(a) and 7(b) are views illustrating the structure and the operation of the plasma processing apparatus according to the embodiment of the invention, wherein FIG. 7(a) is a view showing a state where an opening portion is opened and FIG. 7(b) is a view showing a state where the opening portion is closed.

FIGS. 10(a), 10(b) and 10(c) are views showing the structure of history data files that are output by the plasma processing apparatus according to the embodiment of the invention, where FIG. 10(a) is a view showing the contents of a production history file, FIG. 10(b) is a view showing the contents of a plasma monitoring file, and FIG. 10(c) is a view showing the contents of an electric potential change file.

FIGS. 11(a) and 11(b) are views illustrating the function of a file output portion of the plasma processing apparatus according to the embodiment of the invention, wherein FIG. 11(a) is a view showing a file output screen and FIG. 11(b) is an electric potential change data output screen.

MODE FOR CARRYING OUT THE INVENTION

Figure 1:
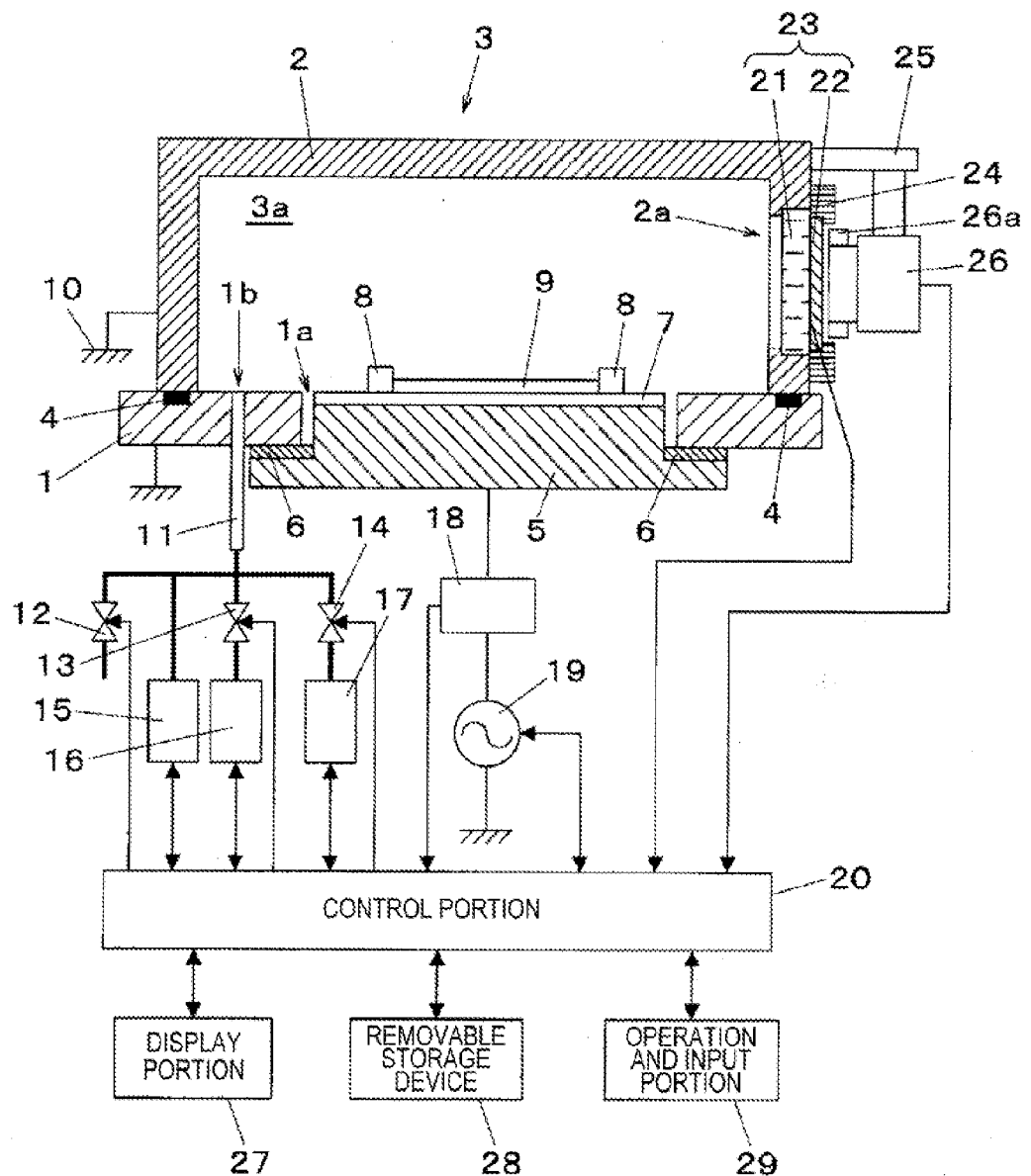
FIG. 1 is a sectional view of a plasma processing apparatus according to an embodiment of the invention.
Figure 2A:
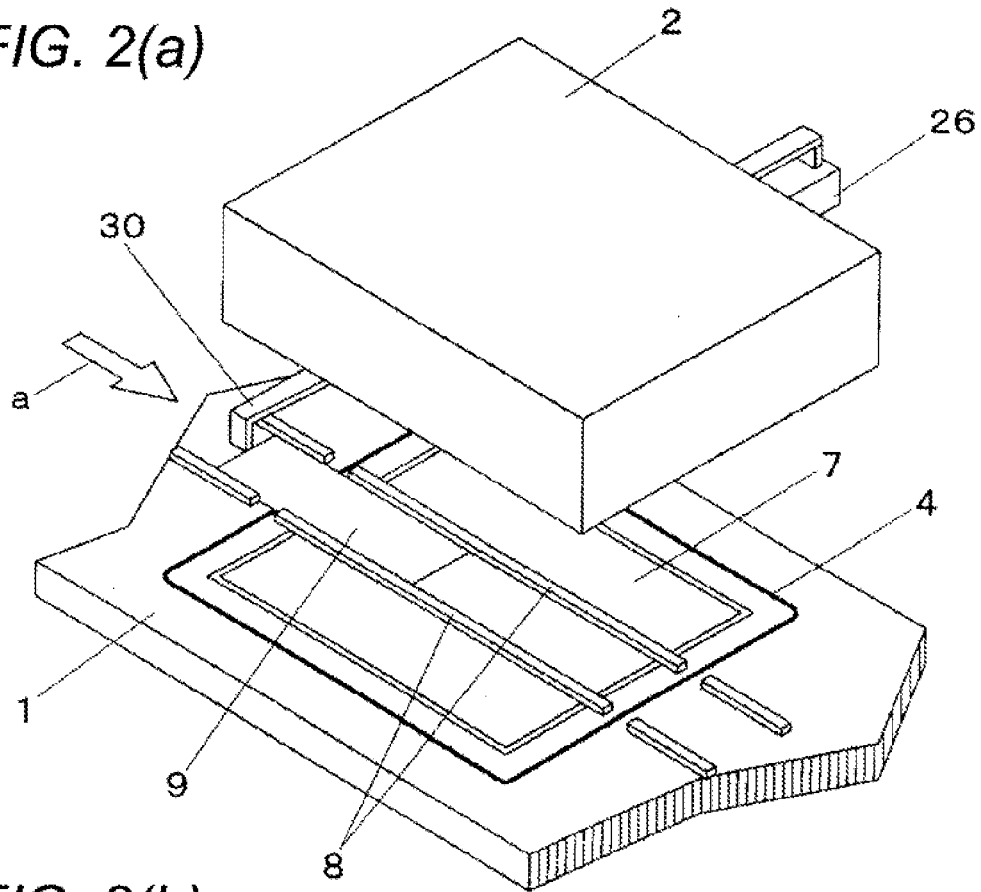
Figure 2B:
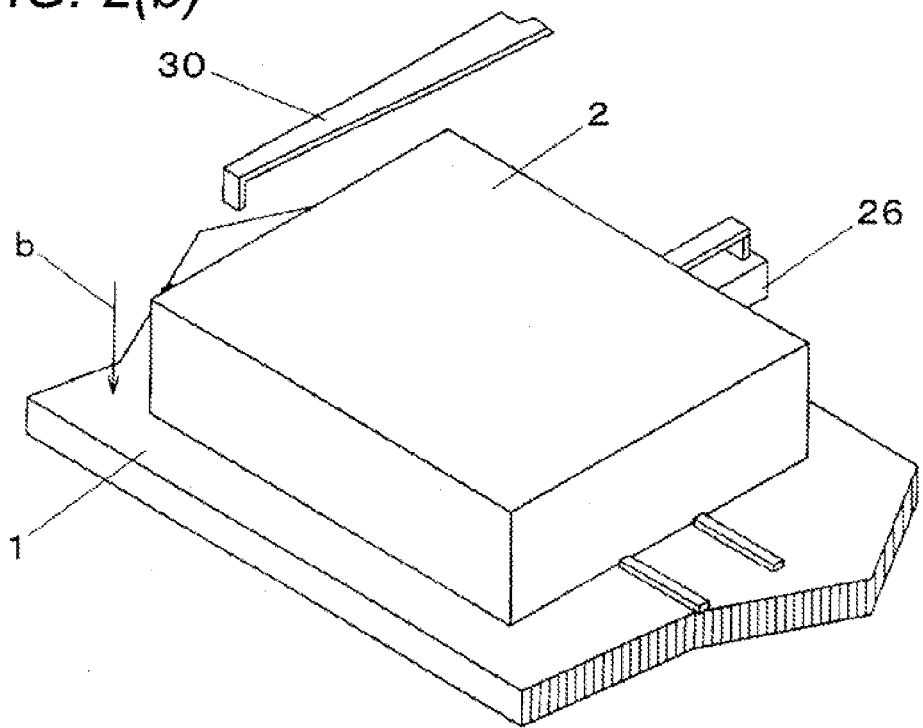
Figure 3:
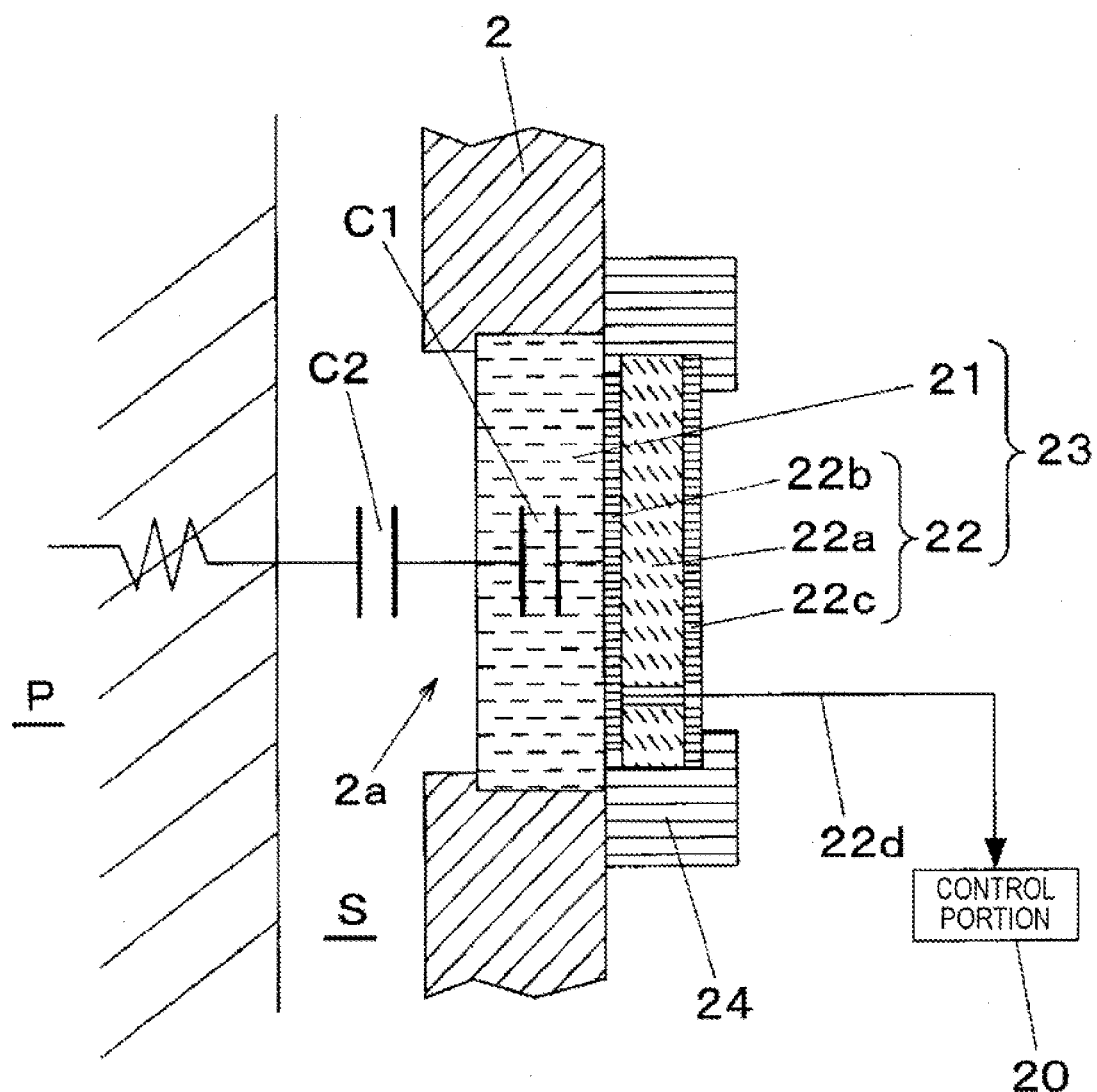
FIG. 3 is a view illustrating the structure of a discharge detection sensor that is used in the plasma processing apparatus according to the embodiment of the invention.
Figure 4:
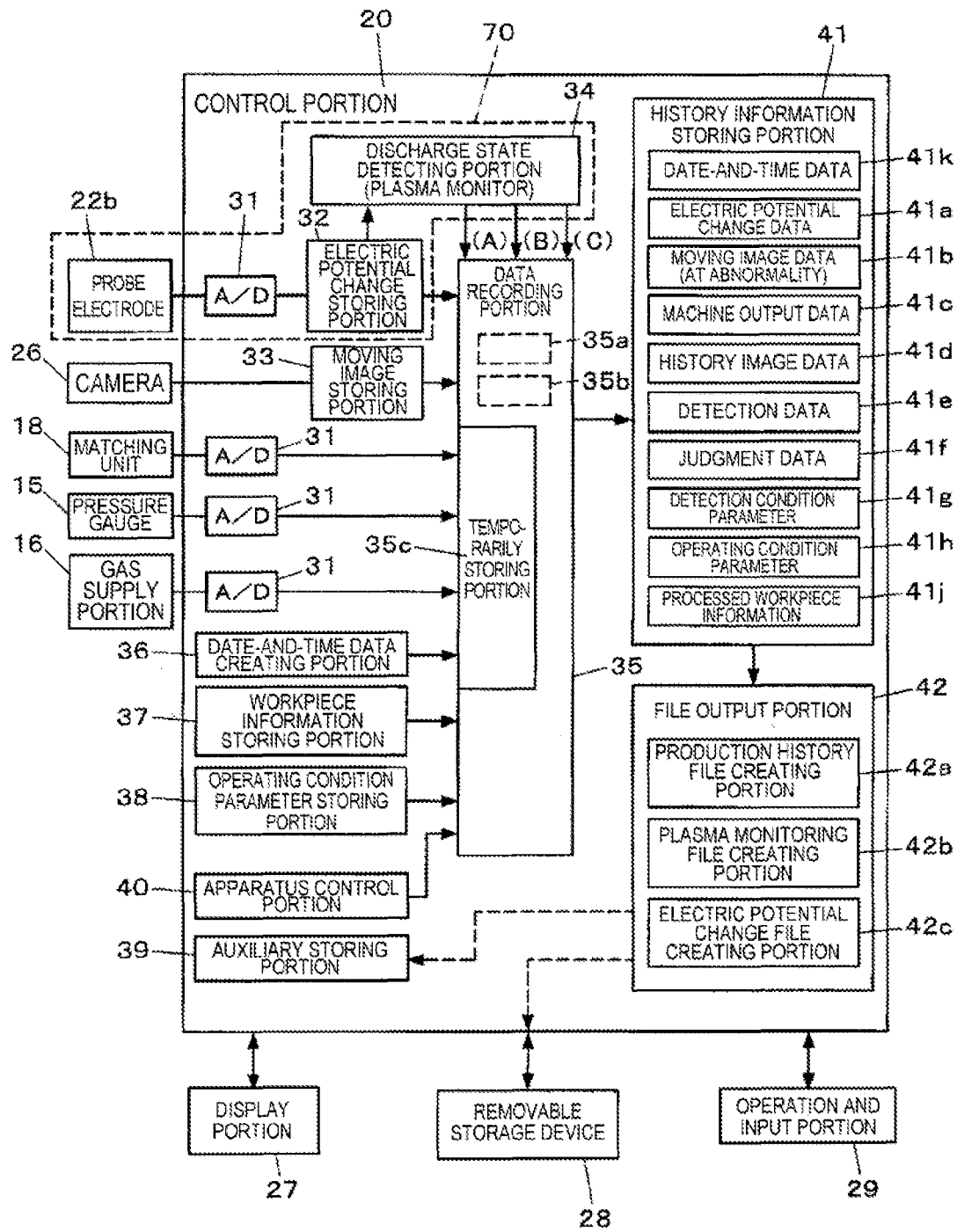
FIG. 4 is a block diagram illustrating the structure and function of a control portion of the plasma processing apparatus according to the embodiment of the invention.
Figure 5A:
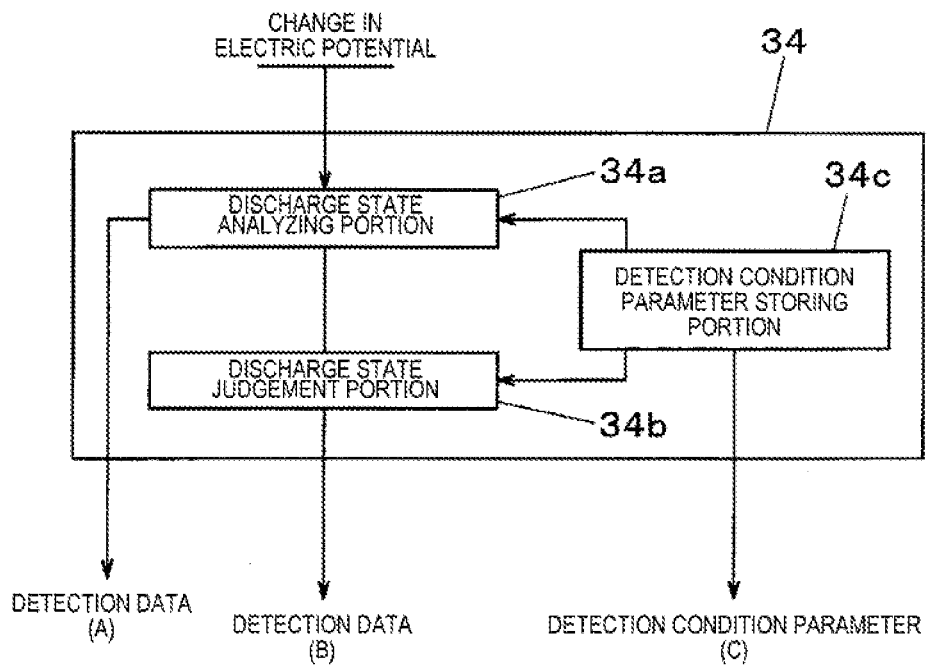
Figure 5B:
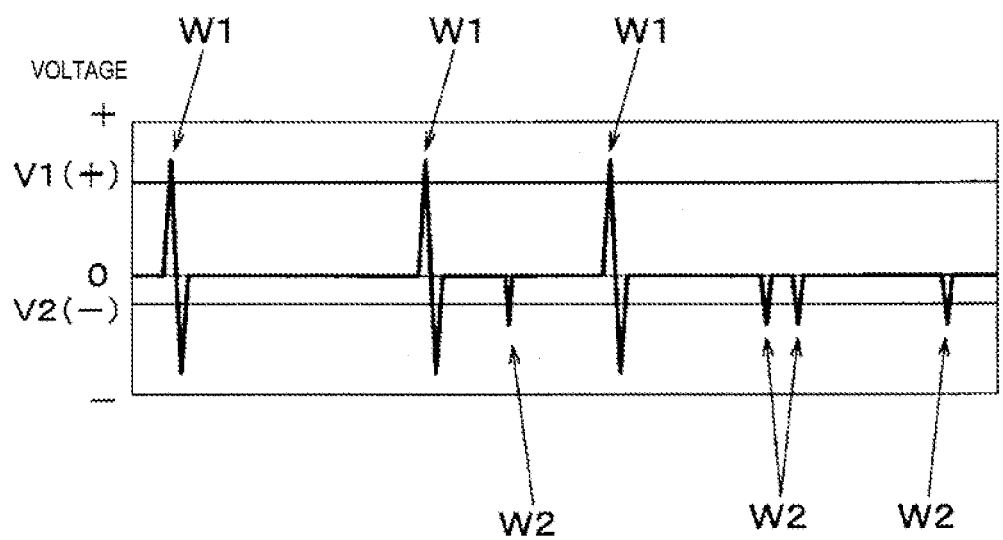
Figure 6:
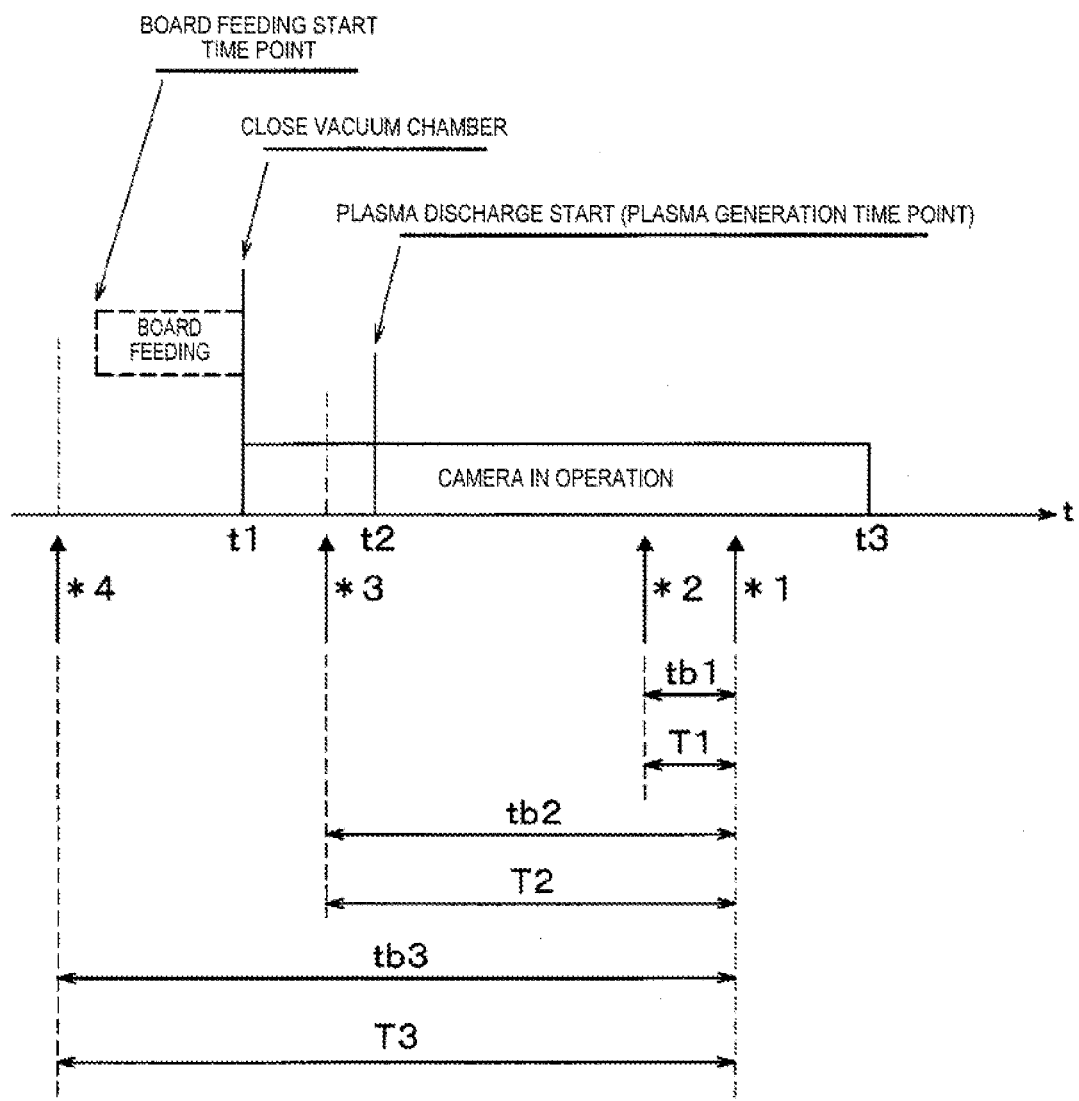
FIG. 6 is a view illustrating the image data extraction processing of the plasma processing apparatus according to the embodiment of the invention.
Figure 7A:
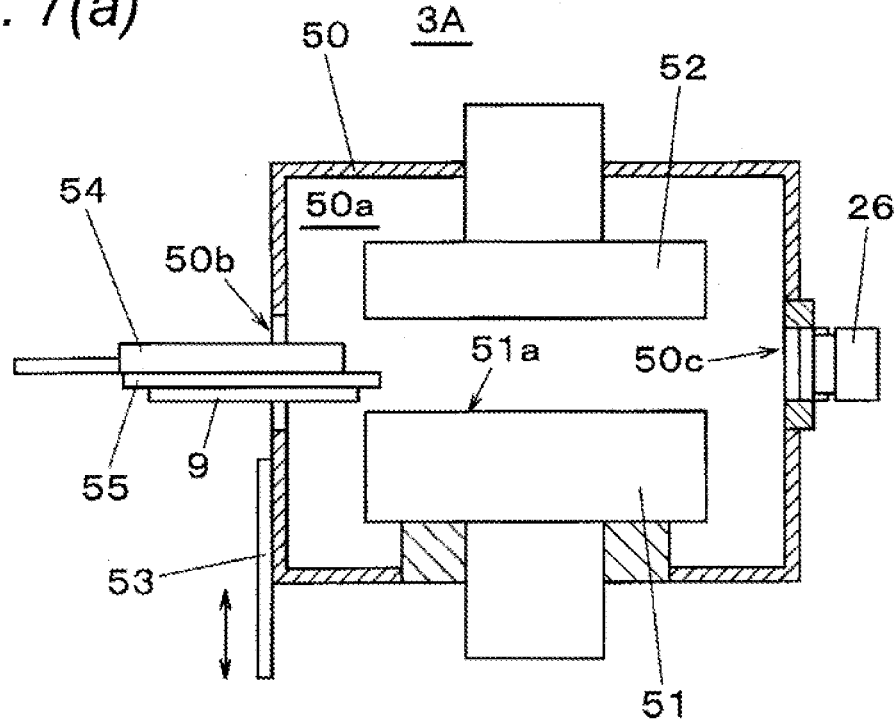
Figure 7B:
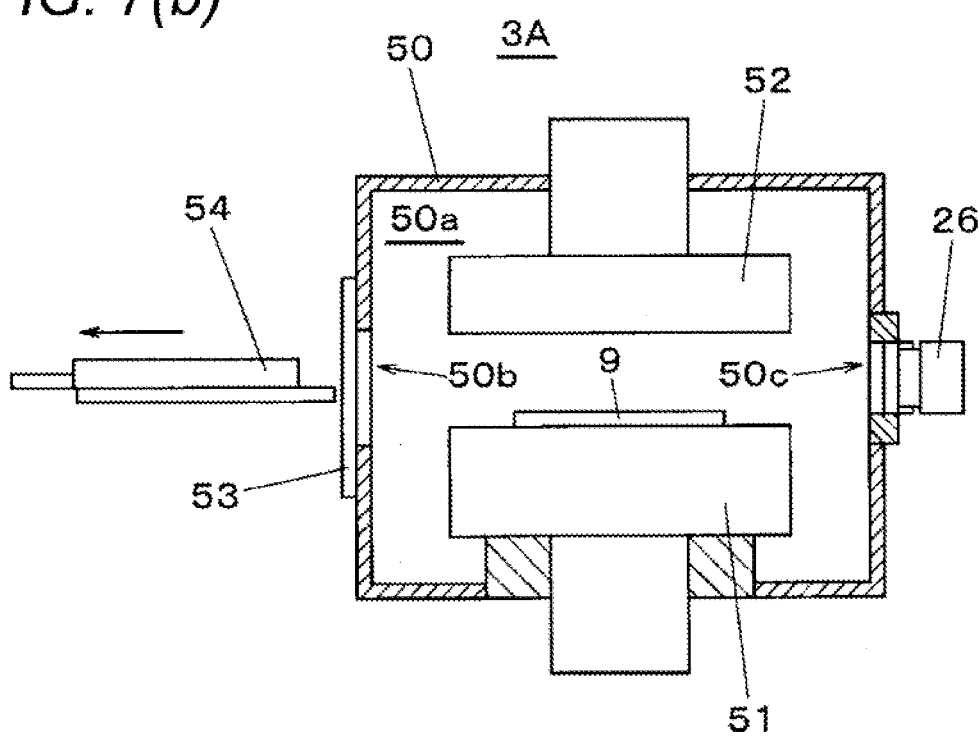
Figure 8:
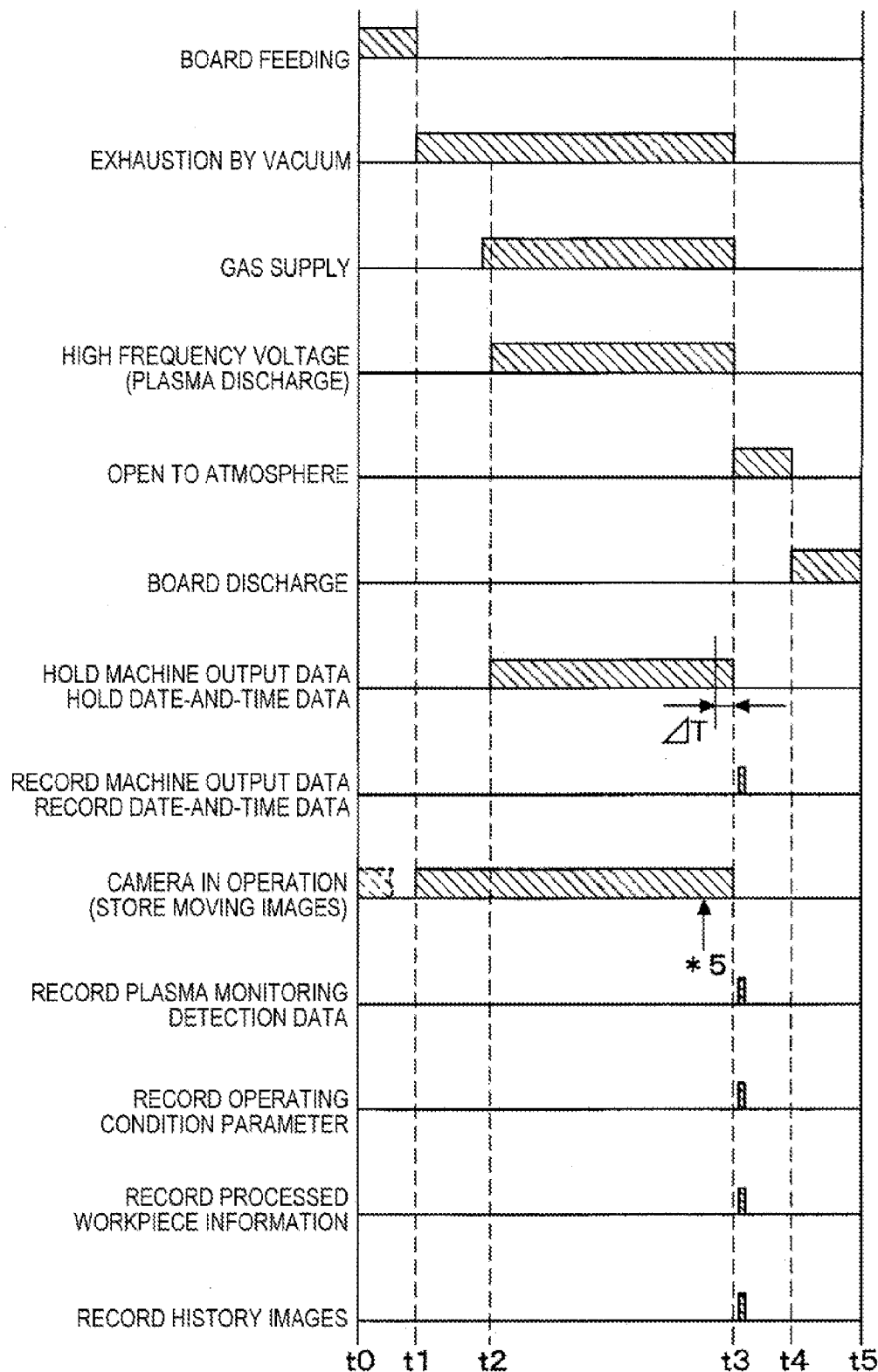
FIG. 8 is a time chart showing the operation and processing of the plasma processing apparatus according to the embodiment of the invention.
Figure 9:
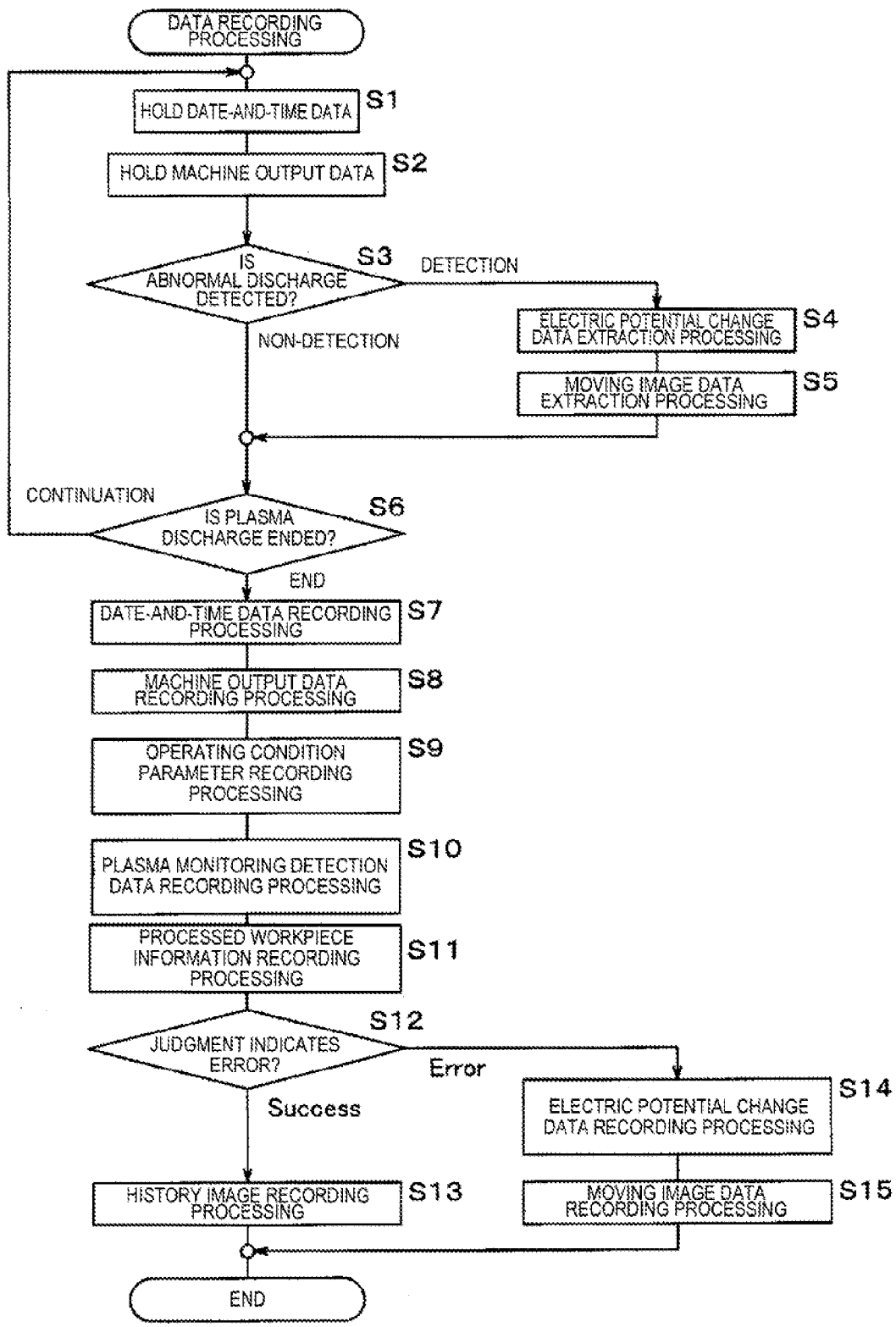
FIG. 9 is a flow chart illustrating the data recording processing of the plasma processing apparatus according to the embodiment of the invention.

FIG. 1 is a sectional view of a plasma processing apparatus according to an embodiment of the invention, FIGS. 2(a) and 2(b) are views illustrating the operation of the plasma processing apparatus according to the embodiment of the invention, FIG. 3 is a view illustrating the structure of a discharge detection sensor that is used in the plasma processing apparatus according to the embodiment of the invention, FIG. 4 is a block diagram illustrating the structure and function of a control portion of the plasma processing apparatus according to the embodiment of the invention, FIGS. 5(a) and 5(b) are views illustrating the function of a discharge state detecting portion of the plasma processing apparatus according to the embodiment of the invention, FIG. 6 is a view illustrating the image data extraction processing of the plasma processing apparatus according to the embodiment of the invention, FIGS. 7(a) and 7(b) are views illustrating the structure and operation of the plasma processing apparatus according to the embodiment of the invention, FIG. 8 is a time chart showing the operation and processing of the plasma processing apparatus according to the embodiment of the invention, FIG. 9 is a flow chart illustrating the data recording processing of the plasma processing apparatus according to the embodiment of the invention, FIGS. 10(a), 10(b), and 10(c) are views showing the structure of history data files that are output by the plasma processing apparatus according to the embodiment of the invention, and FIGS. 11(a) and 11(b) are views showing the function of a file output portion of the plasma processing apparatus according to the embodiment of the invention.

The structure of the plasma processing apparatus will be described first with reference to FIGS. 1, 2(a), and 2(b). In FIGS. 1, 2(a), and 2(b), a vacuum chamber 3 is formed such that a lid portion 2 is disposed on a horizontal base portion 1 so as to be freely elevated by an elevating unit (not shown). In a state where the lid portion 2 is moved down (arrow "b") and comes into contact with the upper face of the base portion 1 through a sealing member 4 as shown in FIG. 2(b), the vacuum chamber 3 is put into a closed state. An air-tight closed space surrounded by the base portion 1 and the lid portion 2 forms a processing chamber 3a in which an object to be processed is accommodated and subjected to plasma processing. An electrode portion 5 is provided in the processing chamber 3a. The electrode portion 5 is fitted to an opening portion 1a, which is formed at the base portion 1, from the lower side through an insulating member 6. An insulating body 7 is attached to an upper face of the electrode portion 5. While both side end portions of a board 9, which is an object to be processed, are guided by guide members 8 as shown in FIG. 2(a), a rear end portion of the board is pushed by a board feeding arm 30. Accordingly, the board is fed onto the upper face of the insulating body 7 in a board feeding direction (the direction of an arrow "a").

An open hole 1b formed at the base portion 1 is connected to a vent valve 12, a pressure gauge 15, a gas supply valve 13, and a vacuum valve 14 through a pipe line 11. Further, the gas supply valve 13 and the vacuum valve 14 are connected to a gas supply portion 16 and a vacuum pump 17, respectively. When the vacuum valve 14 is opened while the vacuum pump 17 is driven, the inside of the processing chamber 3a is exhausted by vacuum. At this time, the degree of vacuum is detected by the pressure gauge 15. The vacuum valve 14 and the vacuum pump 17 form a vacuum exhaust portion by which the inside of the processing chamber 3a is exhausted by vacuum. When the gas supply valve 13 is opened, plasma generating gas is supplied from the gas supply, portion 16 into the processing chamber 3a. The gas supply portion 16 has a flow rate adjusting function. Therefore, it is possible to supply an arbitrary quantity of plasma generating gas into the processing chamber 3a. When the vent valve 12 is opened, the atmosphere is introduced into the processing chamber 3a at the time of breakage of vacuum.

The electrode portion 5 is electrically connected to a high frequency power supply portion 19 through a matching unit 18. When the high frequency power supply portion 19 is driven under the condition that plasma generating gas is supplied into the processing chamber 3a after the completion of exhaustion by vacuum, a high frequency voltage is applied between the electrode portion 5 and the lid portion 2 which is grounded to a ground portion 10. Accordingly, the plasma generating gas is excited in the processing chamber 3a, so that plasma is generated. The matching unit 18 has a function of matching impedance of a plasma discharge circuit, which generates a plasma discharge in the processing chamber 3a, to impedance of the high frequency power supply portion 19. In this embodiment, the electrode portion 5, the matching unit 18, and the high frequency power supply portion 19 form a plasma generating unit that generates plasma by exciting plasma generating gas. Further, the vacuum exhaust portion having the above-mentioned structure, the gas supply portion 16, the electrode portion 5, the high frequency power supply portion 19, the matching unit 18, and an apparatus control portion 40 controlling these respective portions form a plasma processing execution portion. The plasma processing execution portion executes plasma processing for an object to be processed, which is accommodated in the processing chamber 3a, by these respective portions.

A circular window portion 2a, through which an operator can watch the inside of the processing chamber 3a from the outside, is formed at the side of the lid portion 2 of the vacuum chamber 3. A discharge detection sensor 23, which includes a dielectric member 21 and a probe electrode unit 22, is fixed to the window portion 2a from the outside of the lid portion 2 by a support member 24. In addition, on the outside of the probe electrode unit 22, a camera 26 is held on the lid portion 2 by a support bracket 25. While the lid portion 2 is moved down and the processing chamber 3a is formed as shown in FIG. 2(b), the camera 26 takes images of the inside of the processing chamber 3a through the window portion 2a. Then, the camera outputs the result of the taken images as digitized moving image data. Accordingly, it is possible to -visually detect the state of the plasma generated in the processing chamber 3a (the generation state of an abnormal discharge) by moving images and to record the detected state. Since the camera 26 includes an LED illumination portion 26a, it is possible to take images while irradiating the inside of the processing chamber 3a with illumination light by turning on or off the LED illumination portion 26a and to acquire the state in the processing chamber 3a as image information even when plasma is not generated in the processing chamber 3a.

The structure of the discharge detection sensor 23 will be described here with reference to FIG. 3. The dielectric member 21 made of optically transparent glass is attached to the window portion 2a formed at the lid portion 2. In the processing chamber 3a, plasma is generated between the electrode portion 5 and the lid portion 2. The dielectric member 21 is attached to the window portion 2a formed at the vacuum chamber 3 in a posture where one face of the dielectric member 21 faces the plasma generated in the processing chamber 3a.

The probe electrode unit 22 is attached to the other face of the dielectric member 21, that is, the face outside the vacuum chamber 3. The probe electrode unit 22 is an integrated part in which a probe electrode 22b is formed on one face of a glass plate 22a and a shielding electrode 22c is formed on the other face. When the probe electrode unit 22 is attached to the dielectric member 21 and the discharge detection sensor 23 is formed, the probe electrode unit 22 is supported at the lid portion 2 by the support member 24 made of conductive metal under the condition that the probe electrode 22b comes into close contract with an outer face of the dielectric member 21. The probe electrode 22b is connected to a control portion 20 through a detection lead wire 22d.

When plasma P is generated in the processing chamber 3a, the probe electrode 22b is electrically connected to the plasma P through the dielectric member 21 and a sheath S that is a space electric charge layer formed on the interface between the plasma P and the dielectric member 21. That is, an electric circuit is formed in which a capacitor C1 formed of the dielectric member 21, capacitor C2 of the capacity corresponding to the sheath S, and a resistor R having plasma P are connected in series as shown in FIG. 3. An electric potential corresponding to the state of plasma P is induced at the probe electrode 22b. In this embodiment, the electric potential of the probe electrode 22b is introduced to the control portion 20 by the detection lead wire 22d and a signal of a change in the electric potential corresponding to the state of plasma P is analyzed by a discharge state detecting portion 34 (FIG. 4) provided in the control portion 20, so that a discharge state judgment is made.

In the processing chamber 3a, when an abnormal discharge is generated in the periphery of the board 9 placed on the electrode portion 5, a state of plasma P generated in the processing chamber 3a fluctuates. This fluctuation of plasma P changes the impedance of the electric circuit described above. Therefore, this fluctuation is detected as a change in the electric potential of the probe electrode 22b. This change in the electric potential is highly sensitively detected. Therefore, this detection of the change in the electric potential is characterized in that even a minute fluctuation, which can seldom be detected by methods in the related art, can be accurately detected. The shielding electrode 22c has a function of electrically shielding the outside of the probe electrode 22b. Therefore, an electric charge generated at the shielding electrode 22c is released to the grounded lid portion 2 through the conductive support member 24. Due to the foregoing, noise with respect to the change in the electric potential induced at the probe electrode 22b is reduced.

In this embodiment, both the probe electrode 22b and the shielding electrode 22c are formed in such a manner that a transparent conductive material such as ITO (Indium Tin Oxide) is coated on the surface of the glass plate 22a in the shape of a film. Due to this structure, when the discharge detection sensor 23 is attached to the window portion 2a, an operator can take images of the inside of the processing chamber 3a from the outside of the lid portion 2 through the window portion 2a by the camera 26. That is, the discharge detection sensor 23 shown in this embodiment includes the plate-shaped dielectric member 21 and the probe electrode 22b. The plate-shaped dielectric member 21 is attached to the vacuum chamber 3 so that one face of the window portion 2a faces the plasma generated in the processing chamber 3a. The probe electrode 22b is a transparent electrode made of an optically transparent conductive material, and is provided on the other face of the dielectric member 21. Due to the above structure, both the window portion 2a through which images of the inside of the processing chamber 3a is taken and the probe electrode 22b through which a plasma discharge state is monitored can be used at the same time.

The plasma processing apparatus includes the control portion 20 that controls the overall operation. When the control portion 20 controls the vent valve 12, the gas supply valve 13, the vacuum valve 14, the pressure gauge 15, the gas supply portion 16, the vacuum pump 17, and the high frequency power supply portion 19, each operation necessary for the plasma processing can be carried out. Further, the control portion 20 receives the moving images data taken by the camera 26. Furthermore, the control portion 20 receives machine output data output from the high frequency power supply portion 19, the matching unit 18, the vacuum pump 17, the gas supply portion 16, and the pressure gauge 15, which form the plasma processing execution portion, that is, data representing operation states when these respective portions are actually operated to execute plasma processing.

A display portion 27, a removable storage device 28, and an operation and input portion 29 are connected to the control portion 20. The operation and input portion 29 inputs various operations and data at the time of the execution of a plasma processing operation. The display portion 27 displays an operation screen when an input operation is executed by the operation and input portion 29. Further, the display portion 27 displays the data and the like that are stored in each storing portion of the control portion 20. The removable storage device 28 is a removable storage medium such as a USB memory, and stores moving image data taken by the camera 26 or discharge state detection-history data detected by the discharge detection sensor 23.

Next, the structure and function of the control portion 20 will be described with reference to FIG. 4. The control portion 20 includes ND converters 31, an electric potential change storing portion 32, a moving image storing portion 33, a discharge state detecting portion 34, a data recording portion 35, a date-and-time data creating portion 36, a workpiece information storing portion 37, an operating condition parameter storing portion 38, an auxiliary storing portion 39, the apparatus control portion 40, a history information storing portion 41, and a file output portion 42.

Control processing, which executes a plasma processing operation by controlling the above-mentioned plasma processing execution portion, is executed by the apparatus control portion 40 in the structure of the control portion 20. The other components are related to a function of creating traceability data. The traceability data are obtained by changing the production history representing the processing history of each board 9 on which plasma processing is executed by the plasma processing apparatus or the detection history of a discharge state in the processing chamber 3a into data having a predetermined format.

Electric potential change data that are output from the above-mentioned discharge detection sensor 23 and represent the change in electric potential; detection data and judgment data that are output from the discharge state detecting portion 34; image data that are taken in the processing chamber 3a by the camera 26; machine output data that are output from the matching unit 18, the pressure gauge 15, and the gas supply portion 16; and the like are referred to as history object data in this embodiment. Further, these history object data are correlated with workpiece information, operating condition parameters, and the like through date-and-time data, and are recorded as history data in the history information storing portion 41 by the data recording portion 35. The workpiece information specifies each board 9, which is an object to be processed, that is, a workpiece. The operating condition parameters are conditions of the execution of plasma processing. Moreover, the file output portion 42 edits the history data, which are stored in the history information storing portion 41, according to a predetermined format. Accordingly, a plurality of kinds of history files having different purposes of use is created as traceability files and is output to the outside.

The detail of each function will be described below. The A/D converters 31 A/D-convert analog signals that are output from the probe electrode 22b, the matching unit 18, the pressure gauge 15, and the gas supply portion 16. Electric potential change data, which correspond to the change of the state of plasma after signals are output from the probe electrode 22b and A/D-converted, are stored in the electric potential change storing portion 32 and moving image data output from the camera 26 are stored in the moving image storing portion 33. The moving image storing portion 33 corresponds to a first storing portion that stores moving image data output from the camera 26, and the electric potential change storing portion 32 corresponds to a third storing portion that stores the electric potential change data received from the probe electrode 22b, which is a transparent electrode. Both the electric potential change storing portion 32 and the moving image storing portion 33 have predetermined storage capacity. Both the electric potential change storing portion and the moving image storing portion have storage capacity where at least moving image data or electric potential change data corresponding to one-time plasma processing can be stored. Old data of the data, which are stored in the electric potential change storing portion 32 and the moving image storing portion 33, in time series are replaced to new data. Further, a specific time point is designated in time series, so that the electric potential change data and the moving image data corresponding to the specific time point can be specified, respectively.

The discharge state detecting portion 34 is a plasma monitor that monitors a discharge state in the processing chamber 3a. The discharge state detecting portion 34 has a function of detecting a discharge state in the processing chamber 3a on the basis of the electric potential change data stored in the electric potential change storing portion 32 and a function of judging whether a discharge state is good or poor, such as whether an abnormal discharge is generated, on the basis of this detection data for each board 9 that is an object to be processed. Since abnormal discharge causes defects in quality caused by the thermal damage or the like of the board 9, the generation of the abnormal discharge needs to be prevented as much as possible. Further, if the generation of the abnormal discharge is checked, a board 9, which is an object to be processed at a time point where the abnormal discharge is generated, needs to be specified and excluded as a defective product. Furthermore, the generation history of the abnormal discharge needs to be recorded, and a retrospective follow-up investigation from a subsequent step needs to be capable of being executed. The discharge state detecting portion 34 has a function of monitoring a discharge state for this purpose.

The structure and function of the discharge state detecting portion 34 will be described with reference to FIGS. 5(a) and 5(b). As shown in FIG. 5(a), the discharge state detecting portion 34 includes a discharge state analyzing portion 34a, a discharge state judgment portion 34b, and a detection condition parameter storing portion 34c. The discharge state analyzing portion 34a performs a process for obtaining a numerical value, which is necessary for the discharge state judgment portion 34b to judge whether a discharge state is good or poor, from the electric potential change data stored in the electric potential change storing portion 32. The detection condition parameter storing portion 34c stores a judgment threshold value that is referred to by the discharge state analyzing portion 34a or a numerical value that is a judgment reference referred for a judgment of abnormal discharge by the discharge state judgment portion 34b. Next, the processing function of the discharge state analyzing portion 34a will be described.

FIG. 5(b) is a graph showing electric potential change data, which is output from the probe electrode 22b of the discharge detection sensor 23 at the time of the operation of the plasma processing apparatus and is stored in the electric potential change storing portion 32, as waveforms. Here, FIG. 5(b) shows an example where waveforms W1 and W2 are detected. Under a detection condition where a judgment threshold value V1(+) is set on a positive voltage side and a judgment threshold value V2(−) is set on a negative voltage side, the waveform W1 has a pattern that exceeds the judgment threshold value V1(+) on the positive voltage side and exceeds the judgment threshold value V2(−) on the negative voltage side, and the waveform W2 has a pattern that exceeds the judgment threshold value V2(−) on the negative voltage side.

Various waveforms corresponding to the states of plasma discharge are detected at the time of the operation of the plasma processing apparatus. The various waveforms includes a waveform representing that plasma discharge is normally started, and a waveform corresponding to abnormal discharge, such as an abnormal arc discharge or an unstable glow discharge, generated between the electrode portion 5 and a board 9 placed on the electrode portion 5. Since each of these waveforms has a characteristic waveform pattern, it is possible to judge whether a discharge state in the processing chamber 3a is good or poor by discriminating which waveform pattern the detected waveform pattern belongs to and detecting which timing and how often the waveform having a discriminated specific pattern is generated.

The discharge state analyzing portion 34a analyzes the electric potential change data, and obtains a numerical value necessary to judge the discharge state, such as the number of times where the pattern of a waveform exceeds the judgment threshold values V1(+) and V2(−), the number of times of generation of the waveforms W1 and W2, the generation periods of the waveforms W1 and W2, or the frequency of generation of the waveforms W1 and W2 (the number of times of generation of the waveforms per unit time): The numerical value is output as detection data (A). The discharge state judgment portion 34b judges whether or not an abnormal discharge exists or whether or not maintenance time comes by judging whether or not the numerical value obtained by the discharge state analyzing portion 34a satisfies a predetermined condition. Further, if an abnormal discharge is not generated until the plasma processing for the board 9 is completed, "Success" is output as judgment data (B). If an abnormal discharge is detected during plasma processing, "Error" is output as judgment data (B). The judgment data is data representing the result of a discharge state judgment. The discharge state judgment is executed for each board 9 on which plasma processing has been executed. Accordingly, it is possible to judge whether or not each board 9, which is an object to be processed by the plasma processing apparatus, is a non-defective product on which plasma processing has been executed in a normal discharge state. Both the detection data (A) obtained by the discharge state analyzing portion 34a and the judgment data (B) obtained by the discharge state judgment portion 34b are output to the data recording portion 35.

In this embodiment, the discharge state detecting portion 34, the probe electrode 22b that is a transparent electrode provided on the other face of the probe electrode unit 22, the A/D converter 31 that is connected to the probe electrode 22b, and the electric potential change storing portion 32 form a discharge state detecting unit 70 that detects the generation of an abnormal discharge in the processing chamber 3a.

Next, the structure and function of the data recording portion 35 will be described. The data recording portion 35 has a function of recording history object data in the history information storing portion 41. The history object data are acquired from the probe electrode 22b or the camera 26, the gas supply portion 16, the pressure gauge 15, the matching unit 18, and the discharge state detecting portion 34. First, the data recording portion 35 records plasma monitoring detection data in the history information storing portion 41. The plasma monitoring detection data include the detection data (A) obtained by the above-mentioned discharge state analyzing portion 34a, the judgment data (B) obtained by the discharge state judgment portion 34b, and detection condition parameters (C). Further, the data recording portion 35 includes a temporarily storing portion 35c, an image data extracting portion 35b, and an electric potential change data extracting portion 35a as internal functions.

The electric potential change data extracting portion 35a (electric potential change data extracting unit) has a function of extracting data, which show an abnormal discharge as a change in electric potential, from the electric potential change storing portion 32 (electric potential change data extraction processing) and a function of recording the data in the history information storing portion 41 as history data of the abnormal discharge (electric potential change data recording processing). The range of the data to be extracted may include a time period that includes at least the generation period of the abnormal discharge. In this embodiment, data (electric potential change data representing the generation state of the abnormal discharge) corresponding to a time period between the time when an abnormal discharge is not generated yet and a detection time point where the discharge state detecting portion 34 detects an abnormal discharge is an object to be extracted. That is, when the discharge state detecting portion 34 detects the generation of an abnormal discharge by the detection data (A), the electric potential change data extracting portion 35a reads out at least the electric potential change data, which represent the generation state of the abnormal discharge, from the electric potential change storing portion 32, which is the third storing portion, and stores the electric potential change data in the history information storing portion 41, which is a fourth storing portion, as electric potential change data 41a.

The image data extracting portion 35b (image data extracting unit) has a function of extracting moving image data, which show the generation state of an abnormal discharge, from the moving image storing portion 33 when the abnormal discharge is generated (image data extraction processing) and a function of recording the abnormal discharge in the history information storing portion 41 as history data that can be visually understood (moving image data recording processing). The image data extraction processing will be described with reference to FIG. 6. In FIG. 6, an arrow *1 represents a detection time point where the discharge state detecting portion 34 detects an abnormal discharge in a plasma processing process that is executed by starting plasma discharge in the processing chamber 3a after the vacuum chamber 3 is closed and an image starts to be taken by the camera 26. An actual abnormal discharge is generated at the time that is prior to the detection time point *1 by a time lag caused by the processing of the discharge state detecting portion 34.

Generation factors of an abnormal discharge in plasma processing include warpage of a board 9 to be processed, movement of a board 9 in the plasma processing process, a degassing phenomenon where organic materials or moisture contained in a board 9 are changed into gas and discharged from the surface of the board, deposition of foreign materials on the guide members 8 that guides a board 9, and the like. When the warpage or movement of a board 9 occurs, a gap is formed between the board 9 and the insulating body 7 and abnormal discharge is generated at the gap. Further, when pressure locally rises on the surface of the board 9 due to a degassing phenomenon, abnormal discharge is locally generated in this range and abnormal discharge is also generated by the accumulation of electric charges on deposited foreign materials.

In a case where only the presence of an abnormal discharge and a portion where the abnormal discharge is generated may be specified as image data that are necessary to correlate the generation state of the abnormal discharge with a generation factor, moving image data taken in the processing chamber 3a at the generation time point of the abnormal discharge, that is, moving image data showing the generation state of the abnormal discharge are enough. Accordingly, in this case, the image data extracting portion 35b extracts moving image data from the moving image storing portion 33, which is the first storing portion, and stores the moving image data in the history information storing portion 41, which is the second storing portion, as moving image data (at the time of the abnormality) 41b. The moving image data correspond to a time period T1 between a detection time point *1 and a retrospective time point *2, which has gone back from at least the detection time point *1 where an abnormal discharge is detected by a predetermined retrospective time tb1, as a range that reliably includes the moving image data showing the generation state of the abnormal discharge. The retrospective time period tb1 may be at least one second or more, preferably, three seconds or more. The retrospective time period may not exceed a plasma generation time point at the longest. Meanwhile, "the time period T1 between the detection time point *1 and the retrospective time point *2" means a time period that does not include the detection time point *1.

In contrast, information for the explanation of the generation factors is not sufficient when it is obtained only by specifying the portion where an abnormal discharge is generated. Moving image data from a plasma processing start time point are needed to check whether or not an event, which is a generation factor of an abnormal discharge, such as thermal deformation of a board or a local pressure rise caused by a degassing phenomenon, occurs before the generation of the abnormal discharge. That is, the image data extracting portion 35b extracts moving image data from the moving image storing portion 33, which is the first storing portion, and stores the moving image data in the history information storing portion 41, which is the second storing portion, as moving image data (at the time of the abnormality) 41b. The moving image data correspond to a time period T2 between a detection time point *1 and at least a plasma generation time point or a first moving image extraction start time point *3 prior to the plasma generation time point. Accordingly, it is possible to check the correlation between the abnormal discharge and the generation factor generated in the execution process of plasma processing, by the moving image data. Meanwhile, "the time period T2 between the detection time point *1 and the first moving image extraction start time point *3" means a time period that does not include the detection time point *1.

Moreover, when the board 9 is fed into the processing chamber 3a, moving image data where a board feeding operation is recorded are needed to check whether or not an event, which is a generation factor of an abnormal discharge, such as the positional deviation of the board 9 has already occurred before the start of the plasma processing. In this case, the image data extracting portion 35b extracts moving image data from the moving image storing portion 33, which is the first storing portion, and stores the moving image data in the history information storing portion 41, which is the second storing portion, as moving image data (at the time of the abnormality) 41b. The moving image data correspond to a time period T3 between a detection time point *1 and a second moving image extraction start time point *4. Accordingly, it is possible to check the correlation between the abnormal discharge and the generation factor such as the positional deviation or warpage of the board 9 generated during the feeding of the board, by the moving image data. Even in this case, "the time period T3 between the detection time point *1 and the second moving image extraction start time point *4" means a time period that does not include the detection time point *1.

A time period corresponding to the moving image data, which are extracted from the first storing portion and stored in the second storing portion, is previously set in the image data extracting portion 35b by an operator. Accordingly, image data extraction processing to be described below is executed by the moving image data extracting portion 35b according to the setting.

Meanwhile, in the plasma processing apparatus shown in FIGS. 1, 2(a), and 2(b), the camera 26 is provided at the lid portion 2 and is elevated together with the lid portion 2. Accordingly, the camera cannot take images of the inside of the processing chamber 3a in an operation for feeding the board 9 shown in FIG. 2(a). For this reason, if images need to be taken from a feeding start time point as described above, not only the camera 26 provided at the lid portion 2 but also a dedicated camera needs to be separately provided at a position where an image of the upper face of the electrode portion 5 or the base portion 1 can be taken when the lid portion 2 is moved up.

Further, if an image is to be taken together with the image of the board feeding operation using a single camera, the vacuum chamber 3 may be replaced with a vacuum chamber 3A having the structure shown in FIGS. 7(a) and 7(b). In FIGS. 7(a) and 7(b), the vacuum chamber 3A is formed of a single sealed container 50 and the inside of the container 50 forms a processing chamber 50a in which plasma processing is executed on the board 9 to be processed. A lower electrode 51 and an upper electrode 52 are disposed in the processing chamber 50a. The lower electrode is provided with a mount 51a on which the board 9, which is an object to be processed, is placed. The upper electrode is disposed above the lower electrode 51 so as to face the lower electrode.

An opening portion 50b through which the board 9 is fed onto or discharged from the mount 51a is formed at the side of the container 50, and the opening portion 50b is freely opened and closed by an opening/closing mechanism 53. When the opening portion 50b is opened as shown in FIG. 7(a), a board conveying mechanism 54, which sucks and holds the board 9 from the upper face using a suction holder 55, is moved onto the lower electrode 51 through the opening portion 50b in a horizontal direction. Accordingly, the board 9 is placed on the mount 51a.

A window portion 50c, which is the same as the window portion 2a shown in FIG. 1, is formed at the opposite side of the container 50 facing the opening portion 50b so as to correspond to the height position of the mount 51a, and the same camera 26 as the camera shown in FIG. 1 is attached to the outside of the opening portion 50b. In a board feeding operation that feeds the board 9 into the container 50 by the board conveying mechanism 54, it is possible to take an image of the feeding state of the board 9 by operating the camera 26 and to output moving image data.

FIG. 7(b) is a view showing a state where the board conveying mechanism 54 is withdrawn after feeding the board 9 into the container 50 and the opening portion 50b is closed. The plasma processing, which is to be executed on the board 9, is executed in this state, and it is possible to take an image of the state of the board 9 in the plasma processing process by operating the camera 26 in this state. That is, in the vacuum chamber 3A shown in FIGS. 7(a) and 7(b), it is possible to take an image of the state of the board 9 by the single camera 26 both in the plasma processing process and at the time of the board feeding operation and to output moving image data.

When defects in quality caused by abnormal discharge are generated, it is possible to visually understand the state where the abnormal discharge is generated, by storing the moving image data corresponding to an extraction object time period, which is set to include the detection time point of an abnormal discharge and a retrospective time point that has gone back from the detection time point of an abnormal discharge by a predetermined time, such as a plasma generation time point or a feeding start time point at which an operation for feeding the board 9 into the vacuum chamber 3 is started, when the discharge state detecting unit, which detects the abnormal discharge in the processing chamber, detects an abnormal discharge as described above. Accordingly, it is possible to acquire data useful for ascertaining the cause of the abnormal discharge in plasma processing.

Meanwhile, the processing, when the discharge state detecting portion 34 detects an abnormal discharge, has been described above. However, when the discharge state detecting portion 34 does not detect abnormal discharge, the image data extracting portion 35b extracts a history image used to prove that plasma processing is executed on the board 9 in a normal discharge state. It is preferable that images (moving images or still images) taken in a period where plasma is apt to be most stable be images suitable for showing the discharge state in the processing as the history images. Accordingly, a specific period where plasma is estimated to be stable is previously selected, and the history images are acquired by extracting moving image data of the specific period from the moving image storing portion 33 ex-post facto. In this embodiment, image data (moving image data or still image data) corresponding to images acquire period *5, which is set immediately before a processing end time point t3 where plasma processing is stopped as shown in FIG. 6, are used as the history images. The still image data are derived from the moving image data stored in the moving image storing portion 33, and are one frame (one comma) data of the moving image data.

When the discharge state detecting portion 34 does not detect abnormal discharge, the image data extracting portion 35b extracts moving image data or still image data of a specific period in a time period, where images are taken by the camera 26, from the moving image storing portion 33, which is the first storing portion, and stores the moving image data or still image data in the history information storing portion 41, which is the second storing portion, as history image data 41d. The moving images or the still images, which are acquired here, are included in production history information to be described below. Accordingly, it is possible to retrospectively follow up and investigate that plasma processing is appropriately executed on the board 9 in a plasma processing process, from a subsequent step or a finished product where the board 9 is assembled. Therefore, it is possible to secure traceability in plasma processing. Meanwhile, the history image data 41d, which are acquired as the history images, may be any one of moving images or still images. If the history image data are moving images, at the most a few seconds is sufficient. However, the history image data may be still images for the purpose of saving storage capacity.

The temporarily storing portion 35c provided at the data recording portion 35 has a function of temporarily storing and holding the machine output data that are output from the matching unit 18, the pressure gauge 15, and the gas supply portion 16 and the date-and-time data that are output from the date-and-time data creating portion 36. The temporarily storing portion 35c has storage capacity where at least machine output data corresponding to one-cycle plasma processing can be stored. The date-and-time data creating portion 36 includes a clock timer therein, and outputs date-and-time data, which specify the time point, to the data recording portion 35 on the basis of a date-and-time data request signal output from the data recording portion 35. The date-and-time data, which are output here, are data that can specify fine timing including data, hour, minute, and second. Events, which occur at a moment of an abnormal discharge or the like, can also be specified through the date-and-time data, respectively. The output date-and-time data are temporarily stored in the temporarily storing portion 35c, and are linked to the above-mentioned machine output data, the electric potential change data stored in the electric potential change storing portion 32, and the moving image data stored in the moving image storing portion 33.

The workpiece information storing portion 37 stores workpiece information, that is, data that specify the kind of the board 9, which is an object to be processed, and file names that specify operating condition parameters applied to the kind of the board. These kinds of workpiece information are read out by the data recording portion 35, and are recorded in the history information storing portion 41 together with the object specifying data, which individually specify the processed boards 9, as processed workpiece information 41j. The object specifying data include magazine specifying data that specify magazines storing the processed boards 9, and a storage stage number that represents the position of the board stored in each magazine, and the like. These object specifying data are derived from a counter value (a counted value used to count the position (stage number) of a board stored in a magazine), which is referred when the apparatus control portion 40 controls the operation of a board collecting mechanism for storing the plasma-processed board 9 in a magazine, or the like. The object specifying data are read out from the apparatus control portion 40 by the data recording portion 35 and stored in the history information recording portion 41 as processed workpiece information 41j. Accordingly, the apparatus control portion 40 functions as an object specifying data output portion that outputs object specifying data for specifying an object to be processed.

The operating condition parameter storing portion 38 stores operating condition parameters that are set for the board 9 as operating conditions of each portion of the plasma processing execution portion. The operating condition parameters include a high frequency power supply output of the high frequency power supply portion 19, the flow rate of plasma generating gas supplied by the gas supply portion 16, processing time where plasma processing is executed, processing pressure that represents the degree of vacuum in the processing chamber 3a, and the like. The operating condition parameters read out by the data recording portion 35 are recorded in the history information storing portion 41 as operating condition parameters 41h representing the operating conditions actually applied to each board 9 that is a history record object. If data need to be held when processing is executed by the control portion 20, data are frequently and temporarily stored in the auxiliary storing portion 39. The apparatus control portion 40 controls the process operation of plasma processing executed by the above-mentioned plasma processing execution portion.

When plasma processing is executed, control commands based on the operation parameters stored in the operating condition parameter storing portion 38 are output to the plasma processing execution portion having the above-mentioned structure by the apparatus control portion 40 and each portion of the plasma processing execution portion operates according to these control commands. In an actual operation state, the machine output data are output from the matching unit 18, the pressure gauge 15, and the gas supply portion 16 as signals that represent the operating states of the matching unit, the pressure gauge, and the gas supply portion. Here, these machine output data are recorded as processing histories of individual boards 9. When an abnormal discharge is not generated, the machine output data correspond to an expected numerical value. However, when an abnormal discharge is generated, the machine output data correspond to a numerical value significantly different from an expected numerical value. Accordingly, it is possible to more objectively prove that plasma processing is normally executed, by referring the machine output data in addition to the judgment data representing the judgment result in the discharge state detecting portion 34.

Followings are specific examples of the machine output data. First, a flow rate signal, which represents a value of the flow rate of the plasma generating gas, is output from the gas supply portion 16. Further, a vacuum degree signal, which represents the degree of vacuum in the processing chamber 3a, is output from the pressure gauge 15. An RF incident signal, an RF reflection signal, a LOAD signal, a VDC signal, and a PHASE signal are output from the matching unit 18. The RF incident signal is a signal representing a value of electric power, which flows in the high-frequency circuit, of electric power that is output from the high frequency power supply portion 19 to generate plasma. The RF reflection signal is a signal representing a value of electric power, which is reflected due to a change of the impedance of the high-frequency circuit, of the output electric power. The LOAD signal and the PHASE signal are the setting instruction values of a variable capacitor for impedance matching that is built in the matching unit 18, and are expressed by a ratio (0 to 100%) of the distance between pole plates in the state to a variable distance range. The VDC signal represents a value of a self-bias voltage, that is, a voltage where a voltage between electrodes is biased to the negative side at the generation of plasma discharge.

A machine output data reading command, which represents that it is a previously set reading timing, is output from the apparatus control portion 40 in the execution process of plasma processing, so that the machine output data are obtained. When the machine output data reading command is output, the data recording portion 35 holds the machine output data, which are output from the matching unit 18, the pressure gauge 15, and the gas supply portion 16, and the date-and-time data, which are output from the date-and-time data creating portion 36, in the temporarily storing portion 35c; correlates the machine output data with the date-and-time data; and records the data in the history information storing portion 41 as machine output data 41c.

Further, when the data recording portion 35 is to record the electric potential change data, the moving image data (at the time of the abnormality), the machine output data, the history image data, the detection data, and the judgment data in the history information storing portion 41, the data recording portion records these data after linking the date-and-time data, which are created by the date-and-time data creating portion 36, to the electric potential change data 41a, the moving image data (at the time of the abnormality) 41b, and the history image data 41d. Accordingly, it is possible to correlate the electric potential change data 41a, the moving image data (at the time of the abnormality) 41b, and the history image data 41d through common date-and-time data. That is, the history image data 41d and the moving image data (at the time of the abnormality) 41b, which are stored in the second storing portion, and the electric potential change data 41a, which are stored in the fourth storing portion, include date-and-time data as connection information that correlate the history image data and the moving image data with the electric potential change data.

In the history information recorded in the history information storing portion 41, the processed workpiece information 41j, the operating condition parameters 41h, the machine output data 41c, the judgment data 41f, and the history image data 41d, which are added when the judgment result is good, correspond to production history information that include the processing history of plasma processing executed on an object to be processed by the plasma processing execution portion. That is, the production history information includes the judgment result of whether the discharge state of each object to be processed is good or poor, object specifying data that specify the date and time of processing execution and the processed object to be processed, the operating condition parameters that are set as operating conditions of each portion of the plasma processing execution portion, and the machine output data that are output from the plasma processing execution portion as data representing the actual operation state.

Further, the electric potential change data 41a, the moving image data (at the time of the abnormality) 41b, the detection data 41e, and the detection condition parameters 41g correspond to the discharge state detection history information that represents the detection history of a discharge state detected by the discharge state detecting portion 34. Meanwhile, as described below, in this embodiment, when whether a discharge state is good or poor is judged, these kinds of discharge state detection history information are output while being included in discharge state detection history files to be described below only if it is judged that the discharge state is poor.

Next, with reference to FIGS. 8 and 9, there will be described a process of data recording processing that extracts the above-mentioned production history information and discharge state detection history information by the data recording portion 35 and records the extracted information in the history information storing portion 41 in the execution process of plasma processing. The data recording processing is executed on each board 9 that is an object to be processed.

In FIG. 8, when an operation for plasma processing is started at a timing to, first, there is executed board feeding process in which the board 9 to be processed is fed into the processing chamber 3a. That is, as shown in FIG. 2(a), a rear end portion of the board 9 supplied from the upstream side (arrow "a") is pushed by the board feeding arm 30, and the board 9 is fed onto the upper face of the insulating body 7 of the electrode portion 5 while being guided by the guide members 8.

Further, when the board 9 is placed at a processing position on the insulating body 7, the lid portion 2 is moved down (arrow "b") and comes into contact with the base portion 1 and the vacuum chamber 3 is closed as shown in FIG. 2(b). Accordingly, images of the inside of the processing chamber 3a can be taken by the camera 26 provided at the lid portion 2, and images start to be taken to acquire moving image data as history information. Meanwhile, when the vacuum chamber 3A shown in FIGS. 7(a) and 7(b) is provided, images can be taken by the camera 26 from the feeding start time point where the board starts to be fed.

After that, the vacuum pump 17 is operated at a timing t1 where the vacuum chamber 3 is closed, so that the inside of the processing chamber 3a starts to be exhausted by vacuum. When a predetermined degree of vacuum is made in the processing chamber 3a, the gas supply portion 16 is operated and plasma generating gas is supplied into the processing chamber 3a. Then, the high frequency power supply portion 19 is operated at a timing t2 where a gas flow rate reaches a specific rate, so that a high frequency voltage is applied to the electrode portion 5 and plasma discharge is started in the processing chamber 3a. Accordingly, plasma processing for the board 9 is executed.

Subsequently, the exhaustion by vacuum, the supply of gas, and the application of a high frequency voltage are stopped at a timing t3 where a predetermined processing time is up, and image taking of the camera 26 is ended. After that, the plasma processing is stopped and the vent valve 12 is opened, so that the processing chamber 3a is opened to the atmosphere. Further, the processing chamber is completely opened to the atmosphere, the discharge of the board from the processing chamber is started from a timing t4 where the lid portion 2 is moved up, and the discharge of the board from the processing chamber is ended at a timing t5. Accordingly, one cycle of plasma processing is completed.

In the above-mentioned process, a series of data recording processing, that is, the recording of machine output data, the recording of date-and-time data, the recording of plasma detection data (detection data, judgment data, and detection condition parameters), the recording of operating condition parameters, the recording of processed workpiece information, and the recording of history images are executed by the data recording portion 35 after the timing t3 where plasma processing is ended.

The data recording processing will be described with reference to the flow of FIG. 9. The data recording processing is executed at the timing t2 of FIG. 8, that is, at the same time with the start of plasma discharge. First, the data recording portion 35 holds date-and-time data, which are output from a date-and-time data creating portion 36 at the same time with the start of plasma discharge, in the temporarily storing portion 35c (S1). After that, the data recording portion reads out the machine output data output from the gas supply portion 16, the pressure gauge 15, and the matching unit 18 and holds the machine output data in the temporarily storing portion 35c (S2). After (S2), the data recording portion 35 checks whether or not an abnormal discharge is detected by the discharge state detecting portion 34 (S3). If an abnormal discharge is not being detected, the data recording portion 35 judges whether or not a predetermined processing time is up and plasma discharge is ended (S6). If it is checked in (S6) that plasma processing is continuing, the data recording portion 35 repeatedly executes the processing of (S1), (S2), and (S3). While plasma processing continues in a normal state as described above, (S1) and (S2) are continuously executed by the data recording portion 35. As a result, date-and-time data and machine output data are stored in the temporarily storing portion 35c in time series.

If an abnormal discharge is detected in (S3), electric potential change data extraction processing is executed by the electric potential change data extracting portion 35a (S4). In addition, image data extraction processing is executed by the image data extracting portion 35b (S5). In the electric potential change data extraction processing, the electric potential change data extracting portion 35a extracts one-cycle electric potential change data, which include electric potential change data representing the generation state of the abnormal discharge, from the electric potential change data storing portion 32. The extracted electric potential change data are temporarily held by the electric potential change data extracting portion 35a until being stored in the history information storing portion 41 in the electric potential change data recording processing. Moving image data corresponding to any one of time periods that are previously set by an operator, that is, T1, T2, and T3 is extracted in moving image recording processing. Each of the time periods is set to include at least moving image data that represent the generation state of an abnormal discharge. The extracted moving image data are temporarily held by the electric potential change data extracting portion 35b until being stored in the history information storing portion 41 in the moving image data recording processing.

If it is checked in (S6) that the plasma processing is ended, a series of data recording processing, which record the history information of the plasma processing process in the history information storing portion 41, are executed by the data recording portion 35. Meanwhile, as a case where it is checked that the plasma processing is ended, there is automatic stop or an operator's manual operation stop when an abnormal discharge is detected, in addition to a case where a predetermined processing time is up and plasma processing is normally ended.

First, the data recording portion 35 executes date-and-time data recording processing in the series of data recording processing (S7). In this processing, among the date-and-time data held in the temporarily record storing portion 35c, date-and-time data, which are held at last, are stored in date-and-time data 41k of the history information recording portion 41. Accordingly, if plasma discharge is normally ended, the date-and-time data 41k of the history information recording portion 41 are used as date and time where the plasma processing is executed. If an abnormal discharge is detected, the date-and-time data 41k of the history information recording portion 41 are used as date and time where the abnormal discharge is detected.

After that, the data recording portion 35 executes machine output data recording processing (S8), and executes operating condition parameter recording processing (S9). In the machine output data recording processing, the control portion 20 extracts machine output data, which correspond to a timing [t3-Δt] gone back from the timing t3 where plasma discharge is stopped by an arbitrarily set time Δt, from data stored in the temporarily storing portion 35c and stores the machine output data in the machine output data 41c of the history information recording portion 41. The reason to record the machine output data corresponding to the timing [t3-Δt] is that the machine output data corresponding to the timing t3 are data representing the operating state of the plasma processing execution portion after the removal of plasma and cannot be employed as data for traceability. Accordingly, time goes back to a timing where plasma discharge is considered to be stable, and machine output data corresponding to this timing are extracted from the temporarily storing portion 35c and are stored in the machine output data 41c of the history information recording portion 41. The time Δt varies according to the processing speed of the control portion, but it is preferable that the time Δt be set in the range of several tens ms to several hundreds ms. Further, the data recording portion 35 incorporates the date-and-time data, which are recorded in (S7), into the machine output data as connection information and stores the date-and-time data in the machine output data 41c of the history information recording portion 41. A method of using date-and-time data in a part of a file name may be used as a method of incorporating date-and-time data as connection information.

In the operating condition parameter recording processing, the data recording portion 35 reads out the operating condition parameters, which are stored in the operating condition parameter storing portion 38, and stores the operating condition parameters in the operating condition parameters 41h of the history information storing portion 41. Further, the data recording portion 35 incorporates the date-and-time data, which are recorded in (S7), into the operating condition parameters as connection information and stores the date-and-time data in the operating condition parameters 41 h of the history information recording portion 41.

After that, the data recording portion 35 executes plasma monitoring detection data recording processing (S10). The detection data (A), the judgment data (B), and the detection condition parameter (C), which are read out from the discharge state detecting portion 34, are stored in the detection data 41e, the judgment data 41f, and the detection condition parameter 41g of the history information storing portion 41 by plasma monitoring detection data recording processing, respectively. Even in the plasma monitoring detection data recording processing, the data recording portion 35 incorporates the date-and-time data, which are recorded in (S7), into the detection data, the judgment data, and the detection condition parameters as connection information and stores the date-and-time data in the history information storing portion 41.

After that, the data recording portion 35 executes processed workpiece information recording processing (S11). The data recording portion 35 reads out the workpiece information (the information specifying the kind of the board 9 and file names specifying the operating condition parameters) from the workpiece information storing portion 37 and reads out the object specifying data, which specify each board, from the apparatus control portion. Then, the data recording portion creates the processed workpiece information where the date-and-time data of (S7) are incorporated into the workpiece information and the object specifying data as connection information. The data recording portion 35 stores the created processed workpiece information in the processed workpiece information 41j of the history information storing portion 41.

After that, the data recording portion 35 checks the judgment result of whether the discharge state of the board 9 is good or poor that is executed by the discharge state judgment portion 34b (S12). The result of the judgment of whether the discharge state of the board is good or poor is output as judgment data that represent either "Success" (good) and "Error" (poor). If the judgment data correspond to "Success", the data recording portion 35 executes history image recording processing for recording history images, which are used to prove that the board 9 is normally subjected to plasma processing, as production history (S13). Accordingly, the history image data 41d are stored in the history information storing portion 41 by the data recording portion 35. Then, the data recording processing is ended. Even in this case, the data recording portion 35 incorporates the date-and-time data, which are recorded in (S7), into the history image data as connection information and stores the date-and-time data in the history information storing portion 41.

Further, if the result in (S12) corresponds to "Error", the data recording portion 35 executes electric potential change data recording processing (S14) and moving image data recording processing (S15). Then, the data recording portion 35 ends the data recording processing. In the electric potential change data recording processing, the one-cycle electric potential change data held by the electric potential change data extracting portion 35a are stored in the electric potential change data 41a of the history information storing portion 41. In the moving image data recording processing, moving image data, which are held by the image data extracting portion 35b and include the moving image data showing the generation state of an abnormal discharge, are stored in the moving image data (at the time of the abnormality) 41b of the history information storing portion 41. The date-and-time data of (S7) are incorporated into the electric potential change data, which are stored in the history information storing portion 41, as connection information by the electric potential change data extracting portion 35a. Moreover, the date-and-time data of (S7) are incorporated even into the moving image data, which are stored in the history information storing portion 41, as connection information by the image data extracting portion 35b.

As described above, the data recording portion 35 stores the production history information and the discharge state detection history information, which are related to the board 9, in the history information storing portion 41 by executing the data recording processing.

As described above, each time plasma processing for an object to be processed is ended, the data recording portion 35 stores the date-and-time data, the machine output data, the operating condition parameter, the detection data, the judgment data, the detection condition parameter, the processed workpiece information in the history information storing portion 41. Further, if plasma processing is normally ended, the data recording portion 35 stores the history image data in the history information storing portion 41. Furthermore, if an abnormal discharge is generated, the data recording portion 35 stores the electric potential change data and the moving image data in the history information storing portion 41. Since date-and-time data as connection information are incorporated into these data and the like stored in the history information storing portion 41, it is possible to easily retrieve and rearrange the data that correlate the date-and-time data with a clue.

The file output portion 42 has a function of reading out the above-mentioned production history information and discharge state detection history information from the history information storing portion 41, and a function of outputting the information as production history files and discharge state detection history files. The created history files are output to the removable storage device 28 and are temporarily kept in the auxiliary storing portion 39 according to need.

The file output portion 42 includes a production history file creating portion 42a, a plasma monitoring file creating portion 42b, and an electric potential change file creating portion 42c that create files having different data contents according to the purposes of use. The production history file creating portion 42a, the plasma monitoring file creating portion 42b, and the electric potential change file creating portion 42c create a production history file 61, a plasma monitoring file 62, and an electric potential change file 63 that are shown in FIGS. 10(a), 10(b), and 10(c), respectively. The plasma monitoring file 62 and the electric potential change file 63 are discharge state detection history files that have discharge state detection history information as data contents. The discharge state detection history information represents the detection history of a discharge state that is detected by the discharge state detecting portion 34.

The production history file 61 is a file that is obtained by forming production history information, which includes the processing history of the plasma processing for the board 9 executed by the plasma processing execution portion of the plasma processing apparatus, in the form of a data file. The data structure of the production history file is formed so that a user of the apparatus can use the production history file as traceability data in production management. As shown in FIG. 10(a), the production history file 61 includes the data of "magazine" 61a, "storage stage number" 61b, "result" 61c, "date and time" 61d, "setting program" 61e, "operating condition parameter" 61f, "machine output data" 61g, and "image" 61h. Each line of the production history file corresponds to one board 9 that is an individual object to be processed. The "magazine" 61a and the "storage stage number" 61b are object specifying data that specify a processed object to be processed. The "magazine" 61a represents data that specify a magazine in which the plasma-processed board 9 is stored, and the "storage stage number" 61b represents the storage stage number of the magazine in which the board 9 is stored.

The "result" 61c is judgment data showing whether the discharge state of the board 9 is good or poor. When plasma processing is executed in a normal discharge state, "Success" is output. When an abnormal discharge is detected, "Error" and the contents of the error are output. The "date and time" 61d are date-and-time data specifying the date and time where plasma processing is executed, or the date and time where an abnormal discharge is detected. Data files, which specify the workpiece information about the board 9, that is, the kind of the workpiece and plasma processing conditions applied to the board 9, are output to the "setting program" 61e. The "magazine" 61a, the "storage stage number" 61b, the "result" 61c, the "date and time" 61d, and the "setting program" 61e are data that correspond to the processed workpiece information 41j recorded in the history information storing portion 41. The "operating condition parameter" 61f and the "machine output data" 61g are data that correspond to the operating condition parameters 41h and the machine output data 41c recorded in the history information storing portion 41, respectively. History images (moving images or still images), which are used to prove that the board 9 is normally subjected to plasma processing, are output to the "image" 61h together with a data name that specifies this image.

In the invention, it is important that the production history file 61 includes not only the "result" but also the "machine output data" 61g. Even when the "result" meaning whether or not an abnormal discharge exists is "Success", it is not possible to rule out the possibility that an erroneous result is output due to factors such as a mistake in setting the detection condition parameters of the discharge state detecting portion 34 or a malfunction of the probe electrode 22b. However, if the machine output data" 61g are included in addition to the "result" 61c, it is proved that the plasma processing execution portion did not execute an abnormal operation caused by abnormal discharge, using numerical values of the machine output data. Accordingly, the "Success" is accepted as a more reliable result Further, if the production history file 61 includes the "operating condition parameter" 61f, it may also be possible to obtain a merit that it is easy to judge whether the machine output data represent an operation at the time of an abnormal discharge or not.

Meanwhile, the production history file 61 of this embodiment has had the above-mentioned structure, but the "operating condition parameter" 61f and the "image" 61h do not necessarily need to be included in the production history file.

The plasma monitoring file 62 is a file that is obtained by forming data, which are output from the discharge state detecting portion 34, that is, a plasma monitor, in the form of a data file. The plasma monitoring file is created for a maker of the plasma processing apparatus to refer the plasma monitoring file when the maker copes with the troubles of the apparatus. As shown in FIG. 10(b), the plasma monitoring file 62 includes "date and time" 62a, "plasma monitoring detection data" 62b, and "moving image" 62c. Each line of the plasma monitoring file corresponds to one board 9 that is an individual object to be processed.

The "date and time" 62a is date-and-time data specifying the date and time where plasma processing is executed, or the date and time where an abnormal discharge is generated. The "plasma monitoring detection data" 62b are discharge state detection history information. The plasma monitoring detection data include detection condition parameters, detection data, and judgment data. The detection condition parameters are set as detection conditions in a process that detects a discharge state. The detection data represent a detection result that is output from the discharge state detecting portion 34 as data representing the analysis result of the electric potential change data. The judgment data represent the judgment result. Meanwhile, when the judgment result is "Success", the data corresponding to each item of the "plasma monitoring detection data" 62b do not need to be displayed as for the board 9. Only when the judgment result is "Error", the "plasma monitoring detection data" 62b are output. Further, when the judgment result is "Error", the moving image data (at the time of the abnormality) 41b recorded in the history information storing portion 41 are output to the "moving image" 62c together with a data name that specifies the moving image.

When an abnormal discharge is generated in the processing chamber, the electric potential change file 63 is a file that is obtained by forming electric potential change data in the form of a data file. The electric potential change data represent signals of the electric potential change, which is caused by the abnormal discharge, in a waveform. Likewise, the electric potential change file 63 is also created for the maker of the plasma processing apparatus to refer the electric potential change file when the maker copes with troubles of the apparatus. As shown in FIG. 10(c), the electric potential change file 63 includes "date and time" 63a, "waveform data" 63b, and "moving image" 63c. The "date and time" 63a is date-and-time data that specify date and time where an abnormal discharge is detected. The "waveform data" 63b are data that represent the waveform of the electric potential change read out from the electric potential change storing portion 32 by the electric potential change data extracting portion 35a when an abnormal discharge is detected by the discharge state detecting portion 34. The moving image data (at the time of the abnormality) 41b, which correspond to the waveform data and are recorded in the history information storing portion 41, are output to the "moving image" 63c together with a data name that specifies the moving image.

Meanwhile, as the file format of the production history file 61, the plasma monitoring file 62, and the electric potential change file 63, a data format may be selected according to a subject that refers the files. For example, a file format, which can be easily read for production management by a user of the apparatus, such as a CSV file format is selected as the production history file 61. Further, a file format where the data contents can be concealed and a maker of the apparatus frequently is suitable to have access from a remote location through a network to refer these history files when necessary, is selected for the plasma monitoring file 62 and the electric potential change file 63. Accordingly, it is possible to conveniently and appropriately manage a plurality of kinds of history files of which data characteristics as contents are different from each other.

The file output portion 42 displays a file output screen 64, which is shown in FIG. 11(a), on the display portion 27. The file output portion 42 outputs a file, which is output according to the input from an operation button of the file output screen 64, to the removable storage device 28. Four operation buttons, which correspond to "production history" 64a, "plasma monitoring history" 64b, "electric potential change data" 64c, and "current data" 64d, are provided on the file output screen 64. The "production history", the "plasma monitoring history", the "electric potential change data", and the "current data" are output in the form of different combination according to a purpose by an operation of any one of the operation buttons. That is, a screen, which facilitates the input of designation of the end of a period to be kept and the input of a check mark in a check frame 64f selecting whether or not images are attached, is displayed in a period input column 64e by an operation of the "production history" 64a. Meanwhile, the start day of the period to be kept is automatically displayed according to that time point. The production history file 61 (FIG. 10(a)) corresponding to the designated period to be kept is output to the removable storage device 28 by the input of the end of a period to be kept and the check mark. When a user of the apparatus is to output the production history file 61 as data for production management, this output operation is selected.

Likewise, a screen, which facilitates the input of designation of the end of a period to be kept and the input of a check mark to a check frame 64h for the selection of whether or not images are attached, is displayed in a period input column 64g by an operation of the "plasma monitoring history" 64b. The production history file 61 and the plasma monitoring file 62 (FIG. 10(b)) corresponding to the designated period to be kept are output to the removable storage device 28 by the input of the end of a period to be kept and the check mark. When a maker of the apparatus is to compare production history information with abnormal discharge detection history information and retrospectively follows up and investigates the cause of the problem at the occurrence of a problem such as a defect in the plasma processing quality, this output operation is selected.

An electric potential change data output screen 56 shown in FIG. 11(b) is displayed by an operation of the "electric potential change data" 64c and it is possible to select only data, which are judged to be necessary, from a plurality of electric potential change data. That is, a data display column 65a, which shows waveform data recorded in the history information storing portion 41 in the form of a table, is already displayed on the electric potential change data output screen 56. Data numbers 65b that are given to these data in time series, and data names 65c (here, the date and time where an abnormal discharge is generated are used as a file name of corresponding data as it is) corresponding to these data numbers 65b are listed. When the electric potential change data are to be output, first, data is selected from a plurality of data listed in the data display column 65a on the basis of the date and time where an abnormal discharge is generated.

Further, a cursor is pointed to the data that are judged to be unnecessary, and these unnecessary data are deleted by an operation of "delete" 65e. When the operation of "delete" is to be cancelled, "return" 65d is operated. If the number of data is large, the next page is displayed by an operation "next page" 65f is operated and the same operation as described above is executed. After a check mark is input to a check frame 65g in order to select whether or not images/moving images are attached, the selected electric potential change data are output to the removable storage device 28 by an operation of "execute" 65h. When it is to be judged that electric potential change data need to be visually checked as a waveform at the time of the occurrence of the above-mentioned problem, this output operation is selected.

Furthermore, all history information recorded at that time point is output in the form of the production history file 61, the plasma monitoring file 62, and the electric potential change file 68 and is stored in the removable storage device 28 by an operation of "current data" 64d. Accordingly, it is possible to prevent the dissipation of the acquired history data.

All of the production history file 61, the plasma monitoring file 62, and the electric potential change file 63, which are created and output as described above, have data structure that includes connection information correlating the respective data of history files thereof through common date-and-time data. For this reason, even though these files are output as individual files, it is possible to compare the respective data of these history files through the common date-and-time data and to appropriately analyze factors when coping with problems.

As described above, the processing history information, such as production history information or discharge state detection history information, can be arranged for individual products and be output with good operability according to need. Accordingly, it is possible to guarantee the quality of the plasma processing for individual products, to perform retrospective investigation from a subsequent step where a problem has occurred, and to secure traceability in the plasma processing.

Meanwhile, in this embodiment, the data of moving images or still images have been included in the production history file 61, the plasma monitoring file 62, and the electric potential change file 63. However, image data, such as these moving images or still images, are not essential components as production history information or discharge state detection history information, and these image data may be excluded.

The invention has been described with reference to a detailed or specific embodiment, but it is apparent to those skilled in the art that the invention may have various modification or alteration without departing from the sprit and scope of the invention.

This application is based upon Japanese Patent Application (Japanese Patent Application No. 2009-013992), filed on Jan. 26, 2009, the entire contents of which are incorporated herein by reference.

Industrial Applicability

A plasma processing apparatus according to the invention has advantages of acquiring data useful for ascertaining the cause of an abnormal discharge in plasma processing, and is useful in a field where plasma processing is executed on an object to be processed, such as a board.

Description of Reference Skins
    2: lid portion
    2a: window portion
    8: vacuum chamber
    3a: processing chamber
    5: electrode portion
    9: board
    15: pressure gauge
    16: gas supply portion
    17: vacuum pump
    18: matching unit
    19: high frequency power supply portion
    21: dielectric member
    22: probe electrode unit
    22b: probe electrode
    23: discharge detection sensor
    26: camera
    P: plasma

The invention claimed is:

1. A plasma processing apparatus comprising:
    a vacuum chamber that forms a processing chamber in which an object to be processed is accommodated;
    a plasma processing execution portion that introduces plasma generating gas into the processing chamber under a reduced pressure state in the processing chamber, excites the plasma generating gas by applying a high frequency voltage, and executes plasma processing for the object to be processed accommodated in the processing chamber; and
    a discharge state detecting unit that detects an abnormal discharge in the processing chamber,
    wherein the plasma processing apparatus comprises:
    a window portion that is formed at the vacuum chamber;
    a camera that takes images of an inside of the vacuum chamber through the window portion and outputs moving image data;
    a first storing portion that stores the moving image data output from the camera;
    a second storing portion that stores moving image data extracted from the first storing portion; and
    an image data extracting unit that extracts at least moving image data, which show the generation state of the abnormal discharge, from the first storing portion and stores the extracted moving image data in the second storing portion when the discharge state detecting unit detects the abnormal discharge.

2. The plasma processing apparatus according to claim 1, wherein the image data extracting unit extracts moving image data, which correspond to a time period at least from a time point preceding a detection time point of an abnormal discharge by a predetermined time to the detection time point, from the first storing portion and stores the extracted moving image data in the second storing portion.

3. The plasma processing apparatus according to claim 2, wherein the image data extracting unit extracts moving image data, which correspond to a time period from at least a plasma generation time point at which plasma is generated by exciting plasma generating gas to the detection time point, from the first storing portion and stores the extracted moving image data in the second storing portion.

4. The plasma processing apparatus according to claim 2, wherein the plasma processing apparatus comprises an object feeding mechanism that feeds the object to be processed into the vacuum chamber, and wherein the image data extracting unit extracts moving image data, which correspond to a time period from a feeding start time point at which an operation for feeding the object to be processed into the vacuum chamber by the object feeding mechanism is started to the detection time point, from the first storing portion and stores the moving image data in the second storing portion.

5. The plasma processing apparatus according to claim 1, wherein the window portion comprises a plate-shaped dielectric member attached to the vacuum chamber such that one face of the plate-shaped dielectric member faces the plasma generated in the processing chamber, and wherein the discharge state detecting unit comprises: a transparent electrode provided on the other face of the dielectric member; and a discharge state analyzing portion that receives a change in electric potential induced at the transparent electrode according to the change of the plasma and detects the generation of an abnormal discharge.

6. The plasma processing apparatus according to claim 5, comprising:
a third storing portion that stores electric potential change data received from the transparent electrode;
a fourth storing portion that stores the electric potential change data read out from the third storing portion; and
an electric potential change data extracting unit that reads out at least electric potential change data representing a generation state of the abnormal discharge from the third storing portion and stores the electric potential change data in the fourth storing portion when the abnormal discharge is detected,
wherein the moving image data stored in the second storing portion and the electric potential change data stored in the fourth storing portion include connection information that correlates the moving image data with the electric potential change data.

* * * * *